US006484843B2

(12) United States Patent
Yoshii et al.

(10) Patent No.: US 6,484,843 B2
(45) Date of Patent: Nov. 26, 2002

(54) SPEAKER APPARATUS EQUIPPED WITH MEANS FOR PRODUCING COMPLICATED WAVEFORM OF LOW FREQUENCY WITH HIGHER IMPROVED FIDELITY

(75) Inventors: Hiroyuki Yoshii, Nara (JP); Haruhiko Imamura, Nara (JP)

(73) Assignee: Timedomain Corporation, Nara (JP)

( * ) Notice: Subject to any disclaimer, the term of this patent is extended or adjusted under 35 U.S.C. 154(b) by 0 days.

(21) Appl. No.: 09/726,617

(22) Filed: Dec. 1, 2000

(65) Prior Publication Data

US 2001/0042657 A1 Nov. 22, 2001

(30) Foreign Application Priority Data

Dec. 2, 1999 (JP) .......................................... 11-343026
May 31, 2000 (JP) ...................................... 2000-162527

(51) Int. Cl.[7] .................................................. H05K 5/00
(52) U.S. Cl. ........................ 181/153; 181/156; 181/199
(58) Field of Search ................................ 181/144, 147, 181/153, 155, 156, 199

(56) References Cited

U.S. PATENT DOCUMENTS 3,547,220 A * 12/1970 Watson ....................... 181/153
4,164,988 A * 8/1979 Virva ......................... 181/156
6,186,269 B1 * 2/2001 Vollmer et al. ............. 181/144
6,345,685 B1 * 2/2002 Wells et al. ................ 181/153

FOREIGN PATENT DOCUMENTS

| | | | |
|---|---|---|---|
| JP | 63-020696 | U | 2/1988 |
| JP | 63-106292 | U | 7/1988 |
| JP | 5-056493 | A | 3/1993 |
| JP | 5-145983 | A | 6/1993 |
| JP | 11-355876 | A | 12/1999 |

* cited by examiner

*Primary Examiner*—Khanh Dang
(74) *Attorney, Agent, or Firm*—Birch, Stewart, Kolasch & Birch, LLP

(57) ABSTRACT

In a speaker apparatus equipped with a speaker unit including a magnet, a frame and a diaphragm, a speaker housing has a substantially cylindrical shape, and also has such a structure that the speaker unit is secured onto one end surface of the cylindrical shape of the speaker housing so as to substantially cover the speaker unit except for front and back surfaces of the diaphragm. Further, the speaker housing has an opening in another end surface of the cylindrical shape thereof. A support bar extends and has one end secured to a back surface of the magnet of the speaker unit. Furthermore, a weight is secured to another end of the support bar, and then, the weight holds the support bar in a substantially vertical direction and grounds the magnet acoustically and virtually, thereby attenuating and suppressing oscillation transmitted from the magnet to the support bar.

4 Claims, 26 Drawing Sheets

FIRST PREFERRED EMBODIMENT

FIRST MODIFIED PREFERRED EMBODIMENT

SECOND MODIFIED PREFERRED EMBODIMENT

THIRD MODIFIED PREFERRED EMBODIMENT

SECOND PREFERRED EMBODIMENT

FOURTH MODIFIED PREFERRED EMBODIMENT

FIFTH PREFERRED EMBODIMENT

FIFTH MODIFIED PREFERRED EMBODIMENT

SIXTH MODIFIED PREFERRED EMBODIMENT

SEVENTH MODIFIED PREFERRED EMBODIMENT
(MODIFIED PREFERRED EMBODIMENT OF
FIRST PREFERRED EMBODIMENT)

EIGHTH MODIFIED PREFERRED EMBODIMENT

EIGHTH MODIFIED PREFERRED EMBODIMENT

*Fig.16* NINTH MODIFIED PREFERRED EMBODIMENT

NINTH MODIFIED PREFERRED EMBODIMENT

TENTH MODIFIED PREFERRED EMBODIMENT

TENTH MODIFIED PREFERRED EMBODIMENT

ELEVENTH MODIFIED PREFERRED EMBODIMENT

TWELFTH MODIFIED PREFERRED EMBODIMENT

FRAME FITTING PART 5

THIRTEENTH MODIFIED PREFERRED EMBODIMENT

FOURTEENTH MODIFIED PREFERRED EMBODIMENT

FOURTEENTH MODIFIED PREFERRED EMBODIMENT

FIFTEENTH MODIFIED PREFERRED EMBODIMENT
(MODIFIED PREFERRED EMBODIMENT OF
SECOND PREFERRED EMBODIMENT)

SIXTEENTH MODIFIED PREFERRED EMBODIMENT

SEVENTEENTH MODIFIED PREFERRED EMBODIMENT

SPEAKER APPARATUS EQUIPPED WITH MEANS FOR PRODUCING COMPLICATED WAVEFORM OF LOW FREQUENCY WITH HIGHER IMPROVED FIDELITY

BACKGROUND OF THE INVENTION

1. Field of the Invention

The present invention relates to a speaker apparatus, and in particular, to a speaker apparatus for reproducing a complicated waveform of low frequency such as a musical sound or the like with higher improved fidelity.

2. Description of the Related Art

Most conventional speaker apparatuses have a speaker housing having the shape of a box, a spherical shape or the like, and also have a speaker unit whose back surface is closed. In this case, sound waves radiating from the back surface of a diaphragm of the speaker unit are reflected by a wall surface of the speaker housing, and then, the reflected sound waves apply pressure to the back surface of the diaphragm of the speaker unit, to increase a reactance component of the acoustic impedance thereof. As a result, the sound pressure radiated from the front surface of the speaker unit changes according to frequencies, and phase characteristics are considerably disturbed. Then this leads to inhibition of high-fidelity reproduction.

Furthermore, in the conventional speaker apparatus having the box-shaped speaker housing, each surface of the speaker housing is prone to plate vibration. Additionally, a vibration mode is complicated due to reflection of vibration of corner surfaces. Thus, this leads to the occurrence of considerable noise. Consequently, the relationship among the relative times of element waveforms constitute, an original waveform which varies considerably. Therefore, reproducibility of the original waveform with higher improved fidelity is impaired.

In the speaker apparatus of the prior art, the speaker unit is fixed to the above-mentioned speaker housing having a box shape of a frame. In this situation, the vibration of a magnet cannot be suppressed. The vibration is transmitted to the housing through the frame and thus induces the plate vibration. This becomes a major factor of noise caused by the speaker housing. Moreover, the vibration transmitted to the speaker housing is again transmitted to the speaker unit through the frame and generates unnecessary vibration over the whole speaker unit. As a consequence, the transmitted vibration is superimposed onto the intrinsic vibration of the diaphragm, and consequently, the sound quality of the speaker apparatus is further deteriorated.

Furthermore, in the speaker apparatus of the prior art, the diaphragm of the speaker unit is located so as to face the listener. Therefore, the speaker apparatus of the prior art has such disadvantages that the speaker apparatus has sound waves having a high directivity and thus has a narrow coverage area. The speaker apparatus of the prior art having the directivity described above, has other disadvantages in so far as, the speaker apparatus has a narrow coverage area for reproducing a sound field space, and thus cannot obtain a satisfactory effect in a hall, a lobby or the like in which many people listen to the sound at the same time.

SUMMARY OF THE INVENTION

An essential objective of the present invention is therefore to provide a speaker apparatus which has less disturbance in the relative time relationship as compared with that of the prior art, which can reproduce a complicated waveform of low frequency such as a musical sound or the like with higher improved fidelity, and also has a wide coverage area for a sound field space.

In order to achieve the aforementioned objective, according to one aspect of the present invention, there is provided a speaker apparatus comprising:

a speaker unit including a magnet, a frame and a diaphragm, the speaker unit electromechanically transducing an input low-frequency signal into oscillation to oscillate the diaphragm, and to generate and radiate sound waves from the front surface of the diaphragm;

a speaker housing having a substantially cylindrical shape, the speaker housing having such a structure that the speaker unit is secured onto one end surface of the cylindrical shape of the speaker housing so as to substantially cover the speaker unit except for front and back surfaces of the diaphragm, and the speaker housing having an opening at another end surface of the cylindrical shape thereof;

a support bar extending and having one end secured to the back surface of the magnet of the speaker unit; and a weight secured to another end of the support bar, the weight holding the support bar in a substantially vertical direction and grounding the magnet acoustically and virtually, thereby attenuating and suppressing oscillation transmitted from the magnet to the support bar.

According to another aspect of the present invention, there is provided a speaker apparatus comprising:

a speaker unit including a magnet, a frame and a diaphragm, the speaker unit electromechanically transducing an input low-frequency signal into oscillation to oscillate the diaphragm, and to generate and radiate sound waves from a front surface of the diaphragm;

a speaker housing having a substantially cylindrical shape, the speaker housing having such a structure that the speaker unit is secured onto one end surface of the cylindrical shape of the speaker housing so as to substantially cover the speaker unit except for front and back surfaces of the diaphragm, and the speaker housing having an opening in another end surface of the cylindrical shape thereof; and support means having one end secured to the back surface of the magnet of the speaker unit, the support means supporting the speaker unit so as to hold the speaker unit in a substantially vertical direction.

In the above-mentioned speaker apparatus, the support bar and the weight are preferably formed by an integrated bar-shaped weight.

The above-mentioned speaker apparatus preferably further comprises a first cushioning member interposed between two parts of the support bar when dividing the support bar into two parts, the first cushioning member attenuating and suppressing oscillation transmitted from the magnet to the support bar.

Further, the above-mentioned speaker apparatus further comprises a second cushioning member interposed between the speaker unit and the speaker housing, the second cushioning member attenuating and suppressing oscillation transmitted from the speaker unit to the speaker housing.

In the above-mentioned speaker apparatus, the frame of the speaker unit preferably comprises a frame fitting part formed so as to be inclined from a vertical direction, and the second cushioning member is preferably formed so as to be fitted to the frame fitting part, inclined from the vertical direction and supporting the frame fitting part.

Further, in the above-mentioned speaker apparatus, the frame fitting part preferably comprises a plurality of projections which are used so as to be press-fitted into the second cushioning member.

Furthermore, the above-mentioned speaker apparatus further comprises an adaptive ring member interposed between the speaker unit and the second cushioning member, and having a shape adapted to receive and fix the frame of the speaker unit.

Still further, the above-mentioned speaker apparatus further comprises absorbing means for substantially absorbing the sound waves and limiting oscillation which are radiated and transmitted from the back surface of the diaphragm.

In the above-mentioned speaker apparatus, the speaker unit and the speaker housing are preferably formed so that the diameter of the frame of the speaker unit is substantially equal to the diameter of the cylinder of the speaker housing.

The above-mentioned speaker apparatus preferably further comprises diffusing means for, in the horizontal direction, substantially diffusing or reflecting the sound waves radiated from the front surface of the diaphragm.

In the above-mentioned speaker apparatus, the speaker housing preferably has either one of a cylindrical shape and an elliptical cylindrical shape.

According to the present invention, the speaker housing is cylindrical, and the weight is connected to the back surface of the magnet through the support bar secured to the back surface of the magnet. Thus, the reactance component of the acoustic impedance of the back surface of the speaker unit is reduced. Then, the impedance load can be substantially equal to the load of pure resistance. As a result, a high-quality reproduced sound, having less disturbance in the relative time relationship among element waveforms constituting a musical sound, can be obtained. Moreover, the speaker housing of the present invention is allowed to stand upright, and thus the front surface of the speaker unit is directed upward. Thus, horizontal directivity about the sound waves from the speaker unit can have an angle of 360 degrees. Therefore, the coverage area for listening can be greatly increased. In addition, reproducibility of the sound field space can be improved. Thus, a complicated waveform of low frequency such as a musical sound or the like can be reproduced with higher improved fidelity.

BRIEF DESCRIPTION OF THE DRAWINGS

These and other objects and features of the present invention will become clear from the following description taken in conjunction with the preferred embodiments thereof with reference to the accompanying drawings throughout which like parts are designated by like reference numerals, and in which:

FIG. 11 is a longitudinal sectional view taken along line C-C' of FIG. 10, and a transverse sectional view of a part of a speaker housing 10 which holding members 72 shown in FIG. 10 are fitted to;

FIG. 24A is a longitudinal sectional view of the adaptive ring member 93, and FIG. 24B is a plan view of the adaptive ring member 93;

DETAILED DESCRIPTION OF THE PREFERRED EMBODIMENTS

Figure 1:
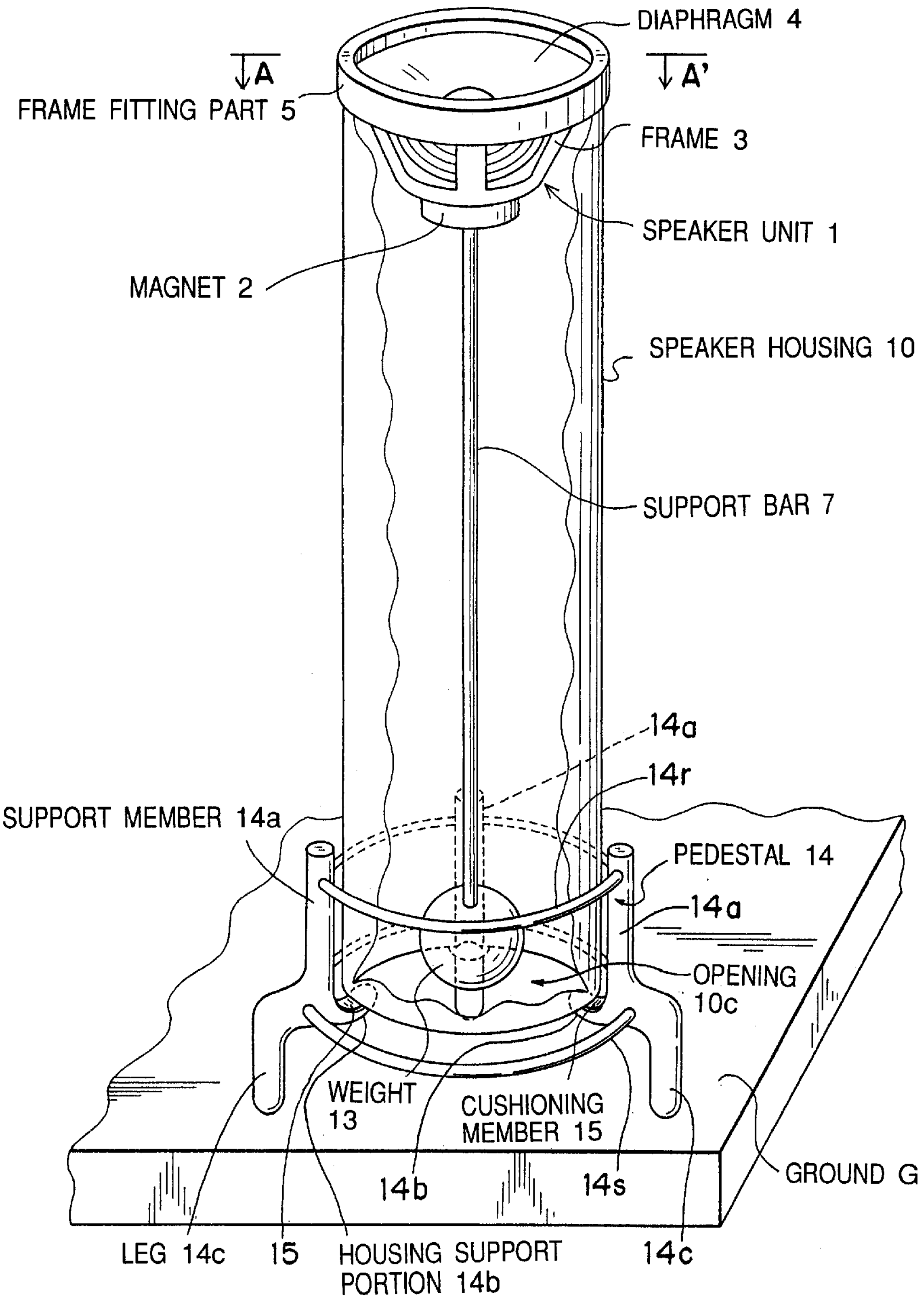
FIG. 1 is a partially broken perspective view of a configuration of a speaker apparatus of a first preferred embodiment according to the present invention.

Preferred embodiments according to the present invention will be described below with reference to the accompanying drawings.

In order to solve the problems of the above-described prior art, in particular, to solve the above-mentioned problem of acoustic impedance, the inventors have invented the following preferred embodiments according to the present invention on the basis of such knowledge of the inventors that it is necessary to bring the impedance load as close to resistance load as possible in order to realize high-fidelity reproduction, and it is also necessary to prevent the relative time relationship among element waveforms constituting an original waveform from being broken in order to reproduce a waveform of low frequency with higher improved fidelity. It is noted that, in the following drawings, the same components are indicated by the same reference numerals.

First Preferred Embodiment

Figure 2:
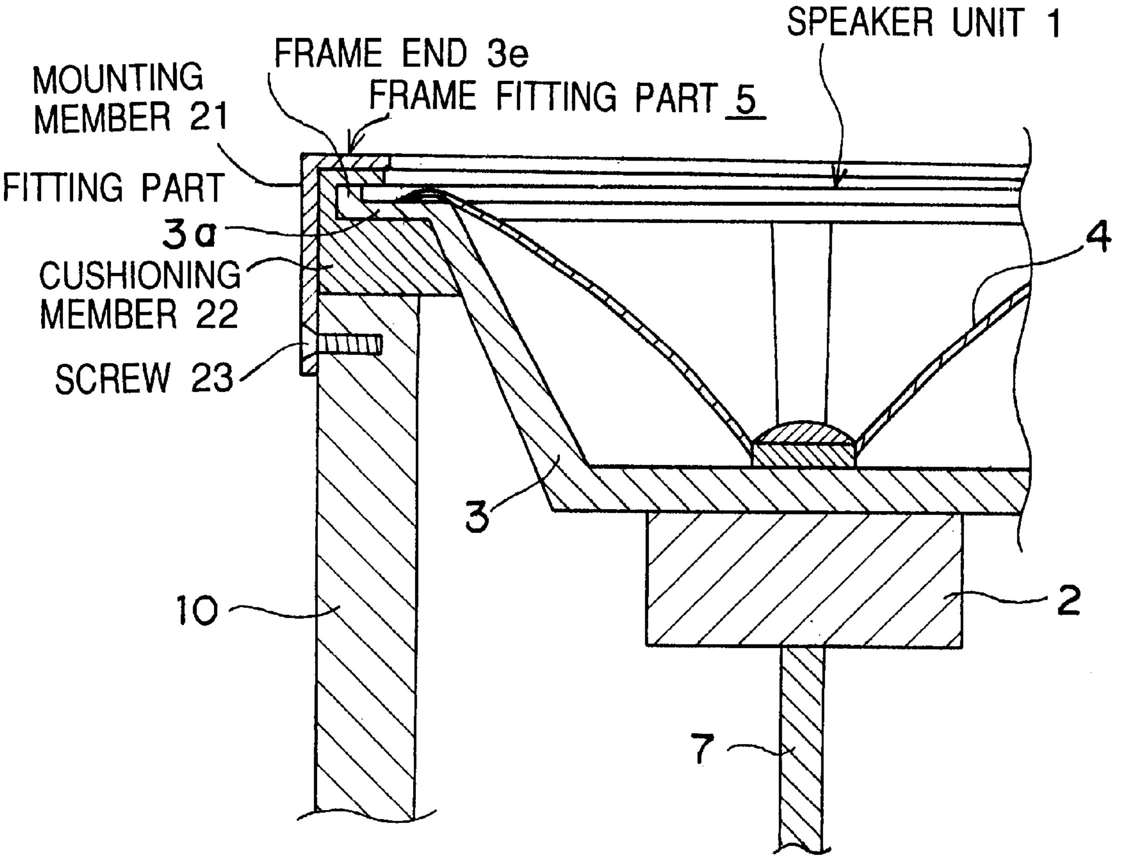
FIG. 2 is a longitudinal sectional view taken along line A-A' of FIG. 1, and an enlarged longitudinal sectional view of a frame fitting part 5 shown in FIG. 1.

FIG. 1 is a partially broken perspective view of a configuration of a speaker apparatus of a first preferred embodiment according to the present invention. FIG. 2 is a longitudinal sectional view taken along line A-A' of FIG. 1 and an enlarged longitudinal sectional view of a frame fitting part 5 shown in FIG. 1.

Referring to FIG. 1, the speaker apparatus of the present preferred embodiment comprises a speaker unit 1 including a magnet 2, a frame 3 and a diaphragm 4, where the speaker unit 1 electromechanically transducing an input low-frequency signal into oscillation or vibration. The speaker apparatus of the present preferred embodiment is characterized by a speaker apparatus that has a structure for minimizing the above-mentioned disturbance in the relative time relationship and for eliminating horizontal directivity of radiation of a sound wave, namely, providing a non-directivity thereof in the horizontal direction. Concretely speaking, a speaker housing 10 is characterized by a speaker housing 10 having the following structure. The speaker housing 10 has a cylindrical shape. On the end surface of one side, i.e., the top side of the cylindrical shape, the speaker housing 10 is secured so as to substantially cover the speaker unit 1 except for front and back surfaces of the diaphragm 4. On the further end surface of another side, i.e., the bottom side of the cylindrical shape, the speaker housing 10 has an opening 10*c*. A weight 13 is secured on the back surface of the magnet 2 through a support bar 7. The weight 13 has a function of attenuating and suppressing oscillation transmitted from the magnet 2 to the support bar 7 by holding the support bar 7 in a substantially vertical direction, and grounding the magnet 2 acoustically and virtually.

In the present specification, the direction perpendicular to the front surface of the diaphragm 4 of the speaker unit 1 (i.e., the upward direction in FIG. 1) is referred to as the direction of the front surface of the speaker apparatus. The direction extending from the back surface of the magnet 2 of the speaker unit 1 downward in FIG. 1 (i.e., the vertical direction) is referred to as the direction of a back surface of the speaker apparatus. A pedestal 14 vertically supports the speaker housing 10 including the speaker unit 1.

The speaker unit 1 comprises the magnet 2, the frame 3 and the diaphragm 4. The speaker unit 1 electromechanically transduces the low-frequency signal into oscillation or vibration to oscillate the diaphragm 4 in response to the input low-frequency signal. Thus, the speaker unit 1 generates and radiates the sound waves from the front surface of the diaphragm 4 which is caused by oscillation or vibration of the diaphragm 4. A voice coil (not shown in FIG. 1) is located in a gap between a yoke and a plate. The low-frequency signal is applied to the voice coil, and this leads to the voice coil oscillating in response to a magnetic flux of the gap in accordance with the input low-frequency signal. Then, the voice coil is mechanically connected to the diaphragm 4. The diaphragm 4 is oscillated in accordance with oscillation of the voice coil. Thus, the sound waves corresponding to the input low-frequency signal are radiated in the upward direction of FIG. 1 mainly from the front surface of the diaphragm 4.

Referring again to FIG. 1, the speaker housing 10 has a structure substantially covering the speaker unit 1 except for the front surface of the diaphragm 4 and the bottom portion of the housing. The speaker housing 10 has a cylindrical shape, which has no substantial flat surface and no corner, and is formed by a continuous surface.

Referring to FIG. 2, the speaker housing 10 is secured to the speaker unit 1. That is, the frame fitting part 5 is secured to a fitting part 3*a* of the frame 3 of the speaker unit 1 by the use of a cylindrical-ring-shaped mounting member 21 through a ring-shaped cushioning member 22 which is interposed between the fitting part 3*a* and the mounting member 21. The cushioning member 22 is made of an elastic body having an ability to disperse pressure, such as polyurethane, a gel material or the like. The cushioning member 22 is provided for attenuating and suppressing the oscillation of the diaphragm 4, so as to prevent the oscillation from being transmitted to the speaker housing 10. The mounting member 21 is screwed to an outer cylindrical surface of the speaker housing 10 by a screw 23 through a lower portion of the mounting member 21, while the fitting part 3*a* of the frame 3 is fitted into an upper portion of the mounting member 21 through the cushioning member 22. Thus, the speaker unit 1 is mounted to the speaker housing 10.

One end of the support bar 7 for supporting the speaker unit 1 is secured to the center of gravity which is located in the center of the back surface of the magnet 2 of the speaker unit 1 by fitting a male thread formed at one end of the support bar 7 into a female thread formed on the back surface of the magnet 2. The weight 13 having a predetermined weight and a spherical shape, for example, is fitted to another end of the support bar 7. Thus, the support bar 7 vertically extends toward the opening 10*c* of the speaker housing 10. The length of the support bar 7 is set so that the weight 13 may not be in contact with the ground G.

The speaker housing 10 is supported on the ground G by the pedestal 14 so that the axial direction thereof may be vertical. The pedestal 14 comprises three support members 14*a*, and circular ring members 14*r* and 14*s* for fixing the support members 14*a*. The three support members 14*a* are spaced at locations with each 120 degrees with respect to each other. The pedestal 14 has such a structure that the ring member 14*r* passes through the upper portions of the support members 14*a*, and the ring member 14*s* passes through the centers of the support members 14*a* so that the three support members 14*a* are fixed by the ring members 14*r* and 14*s*. Each of the support members 14*a* has a leg 14*c*, which is formed at the lower portion of each support member 14*a* and extends downward. Each of the support members 14*a* has a housing support portion 14*b* for supporting and receiving the speaker housing 10, which is formed in the center of each support member 14*a* and projects inward. The speaker housing 10 is supported by the housing support portions 14*b* through a cushioning member 15. The cushioning member 15 is made of an elastic body, such as felt or the like. The cushioning member 15 sandwiched between the speaker housing 10 and the housing support portion 14*b* can reduce the noise resulting from the reflection of the oscillation of the speaker housing 10 from the pedestal 14.

Various kinds of methods such as screwing, press fitting, bonding or welding can be used as a method of coupling or connecting the back surface of the magnet 2 with the support bar 7, and a method of coupling or connecting the support bar 7 with the weight 13. The coupling method is not limited to the above-mentioned methods. Any method can do as long as it enables tight coupling.

Preferably, a material of the speaker housing 10 is metal such as aluminum, transparent resin or glass, not wood as is use in the prior art. Desirably, outer and inner surfaces of the speaker housing 10 are finished with a smooth surface not having any fine convexoconcave in order to prevent vibration mainly composed of longitudinal waves from being reflected by a portion in which the surface suddenly changes in shape. Preferably, the axial length of the cylinder of the speaker housing 10 is equal to any length between a ½ wavelength and a ¼ wavelength of the minimum resonance frequency of the speaker unit 1 generated at the time of the oscillation of the diaphragm 4. The optimum length is determined by actual hearing.

Furthermore, the speaker housing 10 is formed so that the outer diameter of the frame 3 of the speaker unit 1 is substantially equal to the inner diameter of the cylinder of the speaker housing 10. The speaker housing 10 of a cylindrical tube is used as a speaker box. Thus, the sound waves radiated to the back surface of the speaker unit 1 contains only plane waves propagating in the axial direction of the speaker housing 10. Therefore, such complicated standing waves as might be generated in a general speaker box is not generated.

In the speaker apparatus having the above-described configuration, the speaker unit 1 is secured to the speaker housing 10, and is supported by the pedestal 14 through the cushioning member 22, while the magnet 2 of the speaker unit 1 is connected to the weight 13 through the support bar 7. The speaker unit 1 is flexibly supported through the cushioning member 22. Thus, unnecessary vibration or oscillation of the speaker unit 1 is prevented from being transmitted to the speaker housing 10. When the speaker housing 10 is vibrated or oscillated by backward sound pressure radiated by the speaker unit 1, it is possible to prevent the vibration or oscillation from being transmitted to the speaker unit 1.

The support bar 7, which is secured to the back surface of the speaker unit 1 in order to realize the self-supporting speaker housing 10, cannot be fixed directly on the ground G. However, the weight 13 having a large moment of inertia is secured to the end of the support bar 7, and this leads to the magnet 2 being acoustically and virtually grounded, and thus the weight 13 is allowed to function as the virtual ground G. In this case, the minimum resonance frequency $f_0$ of the virtual ground can be calculated by the following equation from the compliance k of the cushioning member 22 and the total weight m (grams) of the speaker unit 1, the support bar 7 and the weight 13:

$$f_0 = \frac{\sqrt{\frac{k}{m}}}{2\pi}. \tag{1}$$

The minimum resonance frequency $f_0$ of the virtual ground must be set to a lower frequency than the minimum frequency desired for reproduction. The function of the virtual ground can attenuate and suppress and can absorb unnecessary vibration or oscillation of the speaker unit 1 generated at the time of the oscillation of the diaphragm 4. Also, this function allows the virtual ground to be used as a reference point for driving the diaphragm 4. Moreover, the function can prevent not only longitudinal vibration but also swing in the horizontal direction of the frame 3 and the magnet 2 of the speaker unit 1.

The advantageous effect of the virtual ground is as follows. For example, when a long and large cylindrical speaker apparatus of 2 meters or more in length such as a floor type is commercially manufactured, vibration control is difficult because of the rigidity of the cylindrical speaker housing 10. However, the cushioning member 22 can prevent transmission of impure vibration of the speaker housing 10 to the speaker unit 1, and can ensure high stability of the speaker unit 1 free from the speaker housing 10.

Furthermore, the weight 13 is connected to the back surface of the magnet 2 through the support bar 7, and this leads to the torsional vibration of the speaker unit 1 around the axial direction which can be prevented by the inertia of a pendulum comprising the support bar 7 and the weight 13.

According to the present preferred embodiment, it is therefore possible to attenuate and suppress the transmission of mechanical vibration generated by the speaker unit 1 to the speaker housing 10. It is also possible to attenuate and suppress mechanical vibration or oscillation transmitted from the speaker housing 10 vibrated by the sound pressure of the back surface of the speaker unit 1 to the speaker unit 1. Moreover, the speaker housing 10 is cylindrical, and the weight 13 is connected to the back surface of the magnet 2 through the support bar 7 secured to the back surface of the magnet 2. Thus, the reactance component of the acoustic impedance of the back surface of the speaker unit 1 is reduced. Therefore, the impedance load can be substantially equal to the load of the pure resistance. As a result, there can be obtained a high-quality reproduced sound having less disturbance in the relative time relationship among element waveforms constituting a musical sound or the like.

Moreover, the speaker housing 10 is allowed to stand upright, and thus the front surface of the speaker unit 1 is directed upward. Thus, horizontal directivity about the sound waves from the speaker unit 1 can have an angle of 360 degrees. As a result, the coverage area for listening can be remarkably increased. In addition, reproducibility of the sound field space can be improved.

Furthermore, the speaker housing 10 has a cylindrical shape, and has no flat portion. Thus, little vibration is generated by the sound waves radiated from the back surface of the speaker unit 1. Therefore, the material of the speaker housing 10 has little influence on the sound quality. Thus, the material of the speaker housing 10 can be selected with a high degree of flexibility so as to give priority to the design thereof. Accordingly, a transparent resin, a glass or the like can be used as the material of the speaker housing 10.

Figure 3:
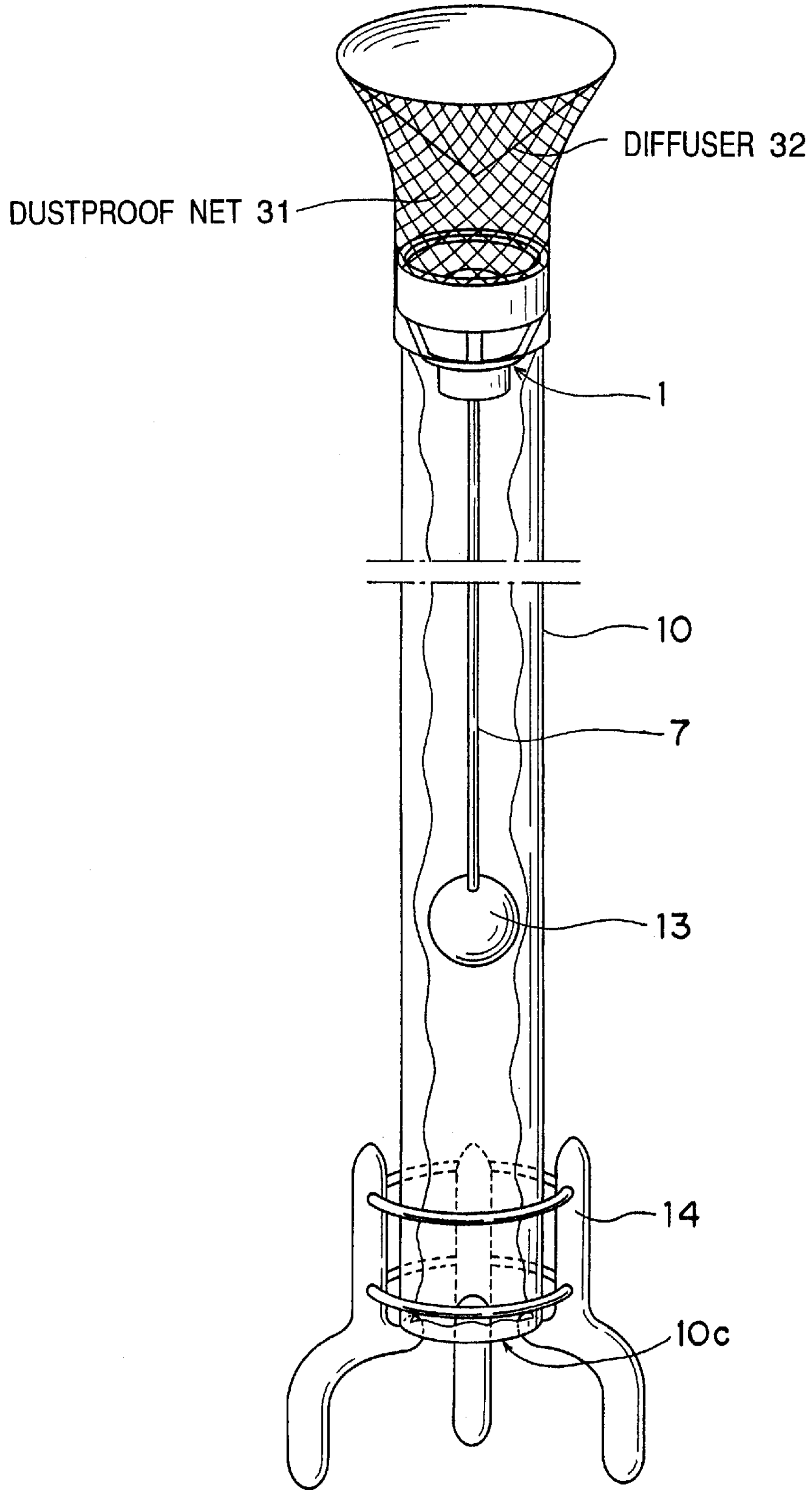
FIG. 3 is a partially broken perspective view of a configuration of a speaker apparatus of a first modified preferred embodiment according to the present invention, which is a modified preferred embodiment of the first preferred embodiment.

FIG. 3 is a partially broken perspective view of a configuration of a speaker apparatus having a length of 2 meters or more of a first modified preferred embodiment according to the present invention, which is a modified preferred embodiment of the first preferred embodiment.

The first modified preferred embodiment is characterized by a diffuser 32 having an inverted cone shape provided on the speaker unit 1 mounted to the speaker housing 10 through a dustproof net 31 which is interposed between the top of the speaker housing 10 and the diffuser 32. The dustproof net 31 is made of a member having a shape of fine-mesh net in order to prevent dust from entering into the speaker unit 1. The diffuser 32 is supported so that the sound waves radiated from the speaker unit 1 can be reflected and diffused by a conical plane and then radiated with horizontal directivity of 360 degrees substantially horizontal and slightly downward from the horizontal direction. That is, the diffuser 32 is supported in such a manner that the axis of the diffuser 32 substantially matches the axes of the speaker unit 1 and the speaker housing 10, and the diffuser 32 has an inverted cone shape. It is to be noted that the opening angle of the apex of the diffuser 32 is set to 90 degrees or more. Optimum angle is determined in accordance with the length of the speaker housing 10.

Figure 4:
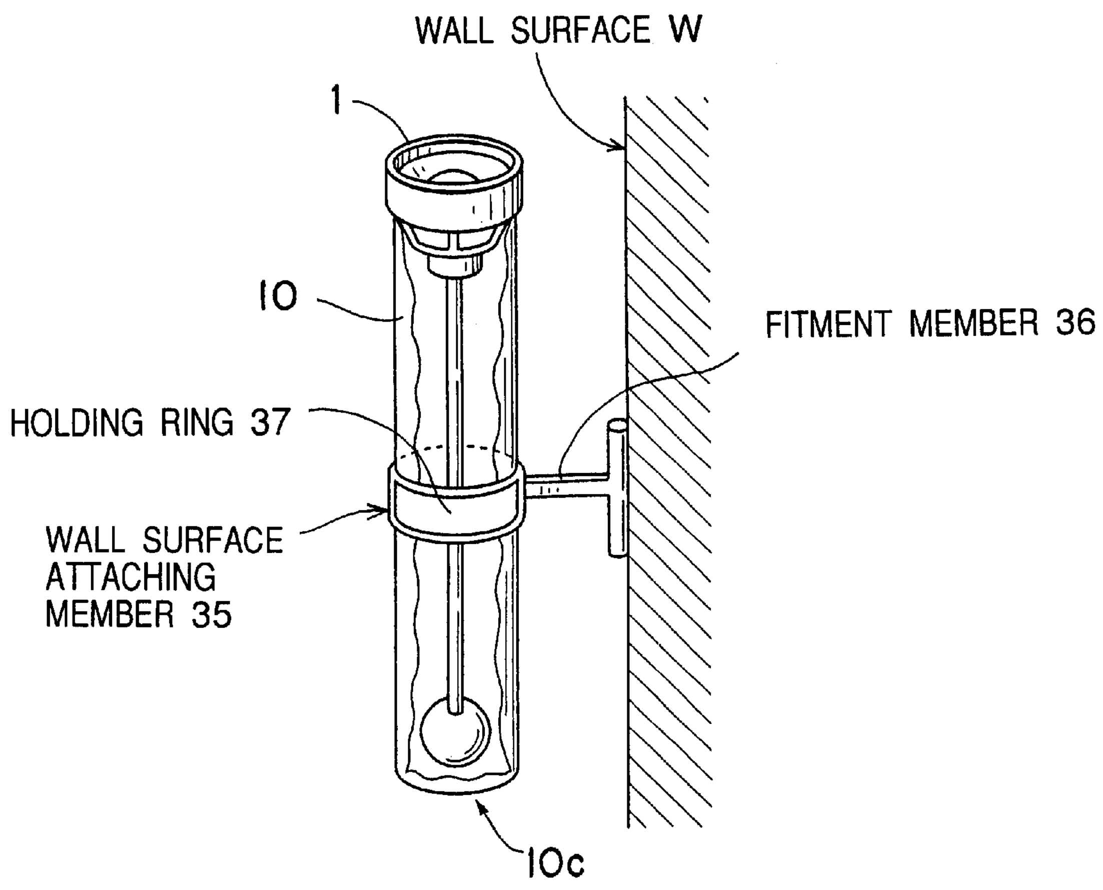
FIG. 4 is a partially broken perspective view of a configuration of a speaker apparatus of a second modified preferred embodiment according to the present invention, which is another modified preferred embodiment of the first preferred embodiment.

FIG. 4 is a partially broken perspective view of a configuration of a speaker apparatus of a second modified preferred embodiment according to the present invention, which is another modified preferred embodiment of the first preferred embodiment.

The second modified preferred embodiment is characterized by speaker housing 10 attached to a wall surface W by the use of a wall surface attaching member 35. The wall surface attaching member 35 comprises a cylindrical-ring-shaped holding ring 37 for holding the speaker housing 10 by holding the periphery of the cylinder of the speaker housing 10, and a fitment member 36 secured to a side surface of the cylinder of the holding ring 37, and to be fitted to the wall surface W by a screw or the like.

Figure 5:
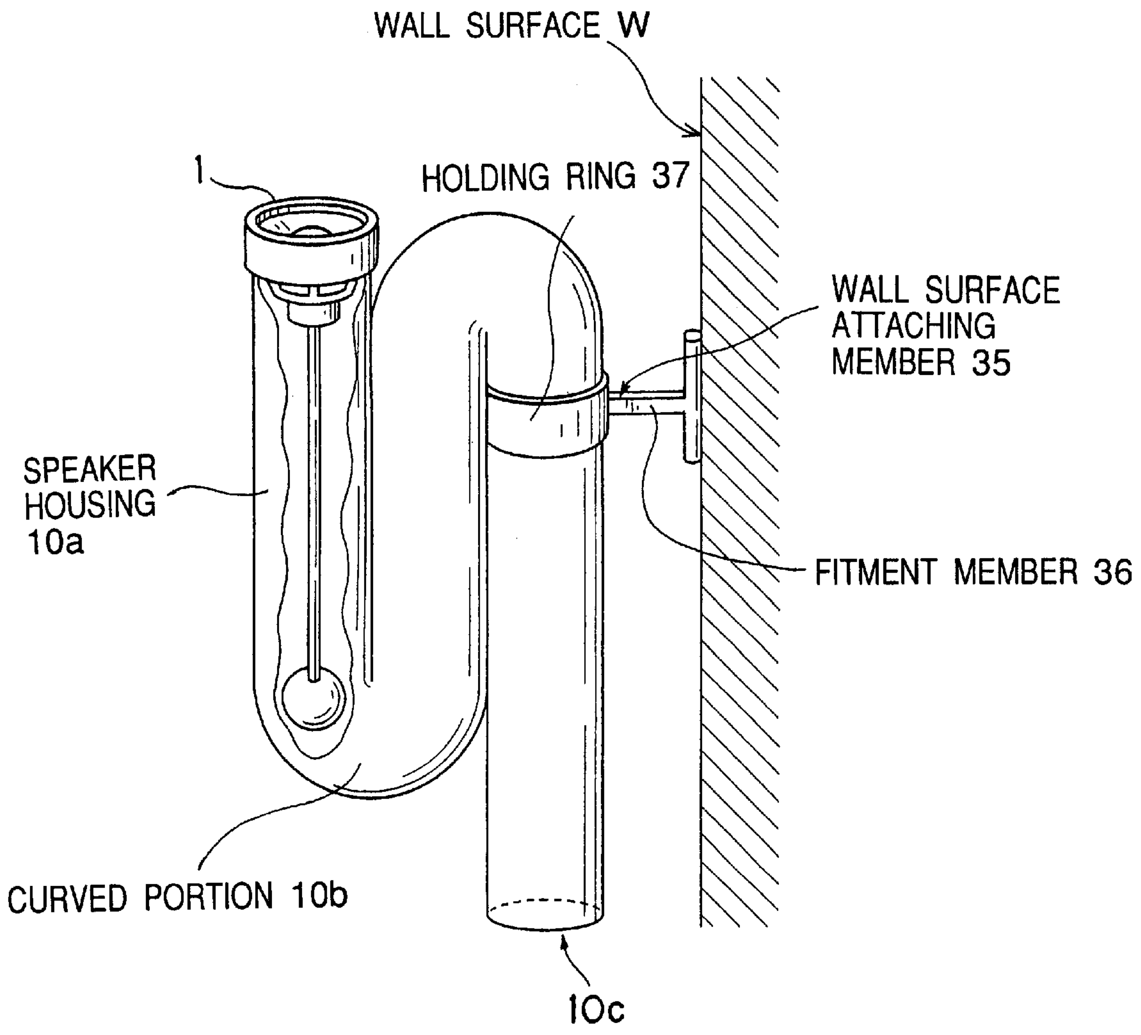
FIG. 5 is a partially broken perspective view of a configuration of a speaker apparatus of a third modified preferred embodiment according to the present invention, which is a further modified preferred embodiment of the first preferred embodiment.

FIG. 5 is a partially broken perspective view of a configuration of a speaker apparatus of a third modified preferred embodiment according to the present invention, which is a still further modified by a preferred embodiment of the first preferred embodiment. The third modified preferred embodiment is characterized by a curved portion 10*b* provided in the cylindrical shape of the speaker housing 10 of the above-described second modified preferred embodiment. This is a device for making a substantial length of the cylinder longer than a vertical length.

Second Preferred Embodiment

Figure 6:
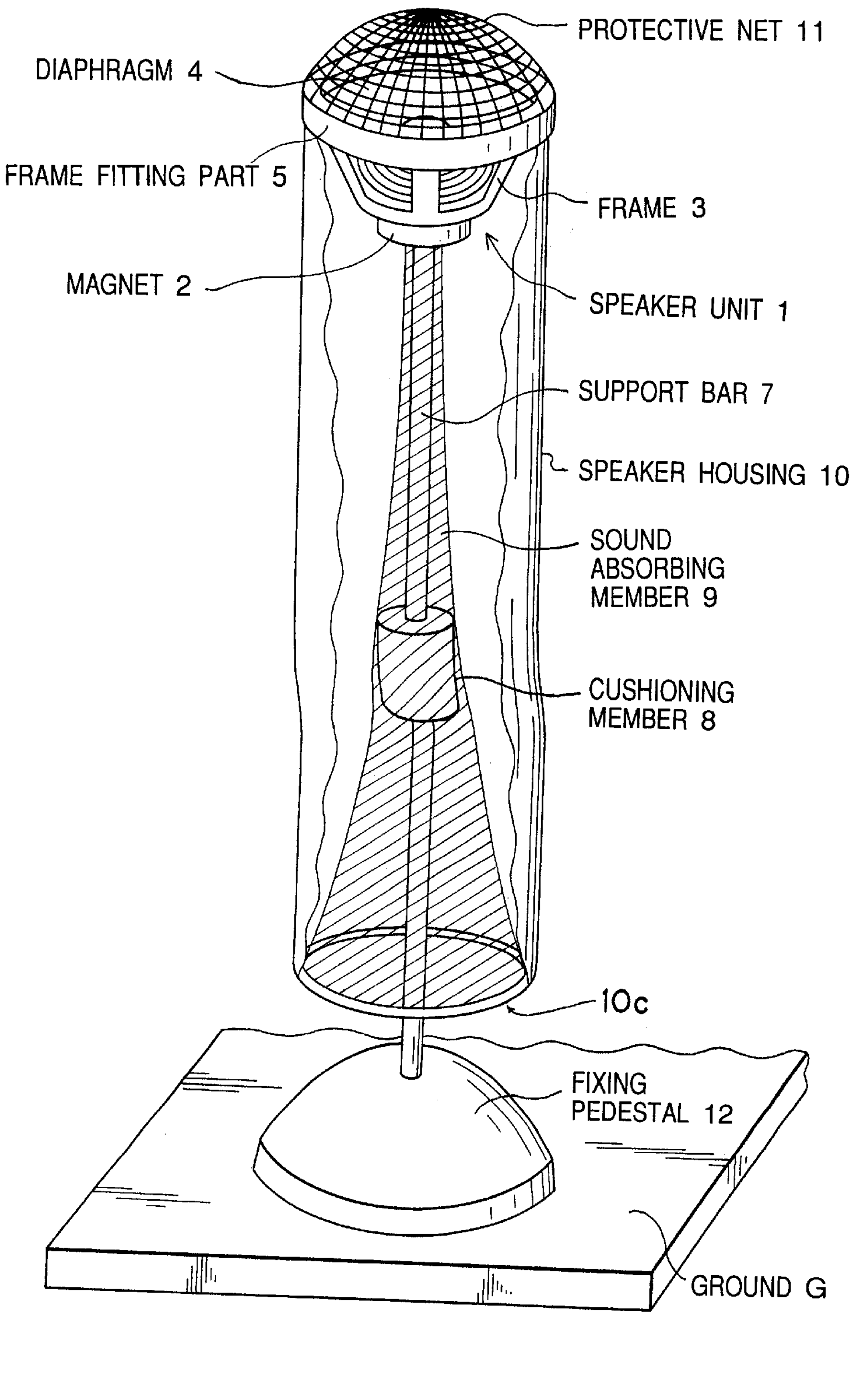
FIG. 6 is a partially broken perspective view of a configuration of a speaker apparatus of a second preferred embodiment according to the present invention.

FIG. 6 is a partially broken perspective view of a configuration of a speaker apparatus of a second preferred embodiment according to the present invention. As compared with the first preferred embodiment, the second preferred embodiment is characterized by a fixing pedestal 12 connected to the back surface of the magnet 2 of the speaker unit 1 through the support bar 7 so that the speaker unit 1 and the speaker housing 10 are supported. The description will be given below with regard to the configuration of the second preferred embodiment, mainly differences between the first and second preferred embodiments.

Referring to FIG. 6, the speaker unit 1 is connected to the speaker housing 10 through the cushioning member 22, in a manner similar to that of the first preferred embodiment. A substantially hemispherical protective net 11 for preventing dust and protecting the diaphragm 4 is mounted on the speaker unit 1.

In the second preferred embodiment, a cushioning member 8, whose size, weight, material or the like differs from that of the support bar 7, is provided at any midpoint in the support bar 7. This leads to the mechanical impedance being suddenly changed, and then, the Mechanical vibration or oscillation transmitted from the upper portion of the support bar 7 to the fixing pedestal 12 which can thereby attenuated and reduced. The vibration or oscillation, which cannot be absorbed and is reflected by the fixing pedestal 12 and the ground G, can be also attenuated and reduced.

Moreover, the speaker housing 10 includes therein a sound absorbing member 9 which is centered on the support bar 7. The sound absorbing member 9, which is made of felt, glass wool or the like, conically extends from the lower portion of the magnet 2 toward the lower opening 10*c* of the speaker housing 10. This leads to the reflected sound waves in the above-mentioned opening 10*c* being reduced.

Various kinds of methods such as screwing, press fitting, bonding or welding can be used as a method of coupling or connecting the back surface of the magnet 2 with the support bar 7, and a method of coupling or connecting the support bar 7 with the cushioning member 8. The coupling method is not limited to the above-mentioned methods. Any method can do as long as it enables tight coupling. Various kinds of methods such as screwing, press fitting, bonding or welding can be used as a method of coupling the support bar 7 to the fixing pedestal 12. The coupling method is not limited to the above-mentioned methods. Any method can do as long as it permits tight coupling. However, a method capable of removing the support bar 7 from the fixing pedestal 12, such as screwing, is desirable for movement, transport or the like.

Figure 7:
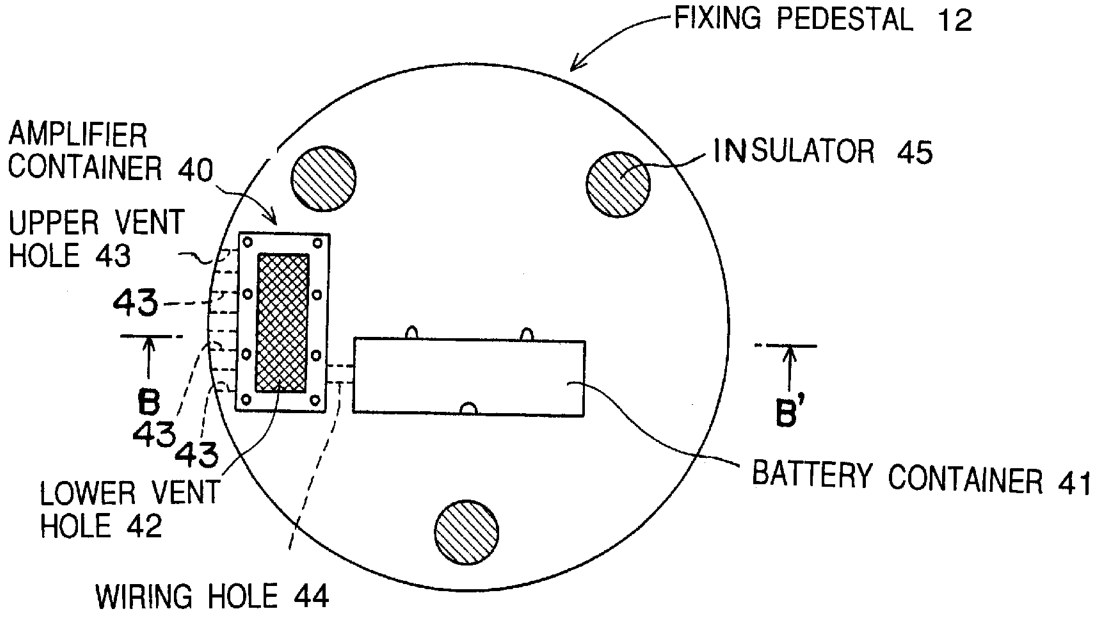
FIG. 7 is a back view of a back surface of a fixing pedestal 12 shown in FIG. 6.
Figure 8:
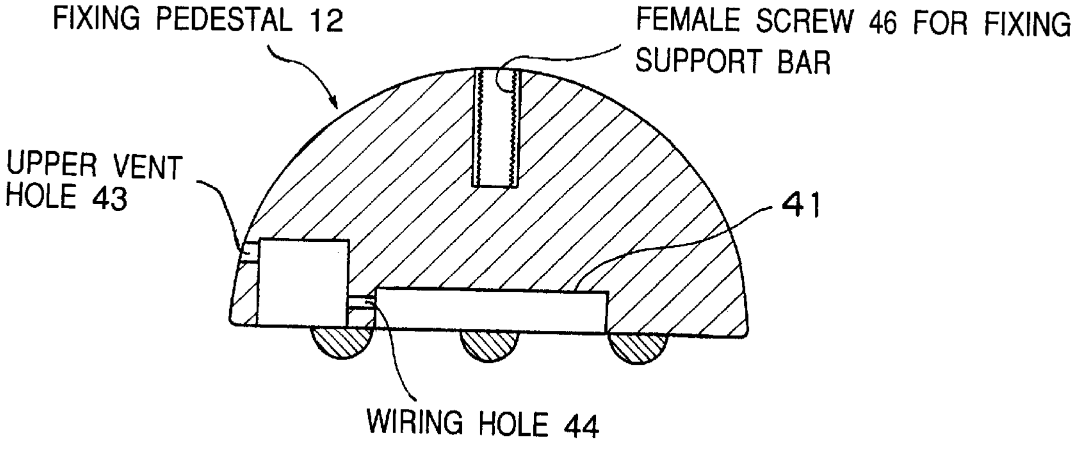
FIG. 8 is a longitudinal sectional view taken along line B-B' of FIG. 7 and a longitudinal sectional view of the fixing pedestal 12 shown in FIG. 6.

FIG. 7 is a back view of the back surface of the fixing pedestal 12 shown in FIG. 6. FIG. 8 is a longitudinal sectional view taken along line B-B' of FIG. 7 and a longitudinal sectional view of the fixing pedestal 12 shown in FIG. 6.

Referring to FIGS. 7 and 8, a female screw 46 for screwing and fixing the support bar 7 is formed in the upper portion of the substantially hemispherical fixing pedestal 12 so that the axial direction thereof becomes vertical. On the other hand, in the lower portion of the fixing pedestal 12, there are formed an amplifier container 40 for containing an amplifier, a battery container 41 for containing a battery of a power source for driving the amplifier, a wiring hole 44 for containing a power supply wire for connecting the amplifier to the battery, and an upper vent hole 43 and a lower vent hole 42 for radiating heat generated by the amplifier. The fixing pedestal 12 is placed on the ground G through, for example, three insulators 45 which are interposed between the fixing pedestal 12 and the ground G, where each insulator 45 is provided for electrically insulating the fixing pedestal 12 from the ground G.

According to the second preferred embodiment having the above-described configuration, the speaker unit 1 is secured to the speaker housing 10 through the cushioning member 22, while the magnet 2 of the speaker unit 1 is connected to the fixing pedestal 12 through the support bar 7 and thus the magnet 2 is supported. In this case, the speaker unit 1 is flexibly supported by the cushioning member 22, and unnecessary vibration or oscillation of the speaker unit 1 is prevented from being transmitted to the speaker housing 10. When the speaker housing 10 is vibrated or oscillated by backward sound pressure radiated by the speaker unit 1, it is possible to prevent the vibration from being transmitted to the speaker unit 1.

The magnet 2 of the speaker unit 1 is connected with the fixing pedestal 12 through the support bar 7 so that the magnet 2 is supported. Therefore, the speaker unit 1 can be fixed directly on the ground G through the support bar 7, and the ground G can be used as the reference point for driving the diaphragm 4.

According to the present preferred embodiment, it is therefore possible to attenuate and suppress the transmission of mechanical vibration generated by the speaker unit 1 to the speaker housing 10. It is also possible to attenuate and suppress mechanical vibration or oscillation transmitted from the speaker housing 10 vibrated by the sound pressure of the back surface of the speaker unit 1 to the speaker unit 1. Moreover, the speaker housing 10 is cylindrical, and the weight 13 is connected to the back surface of the magnet 2 through the support bar 7 secured to the back surface of the magnet 2. Thus, the reactance component of the acoustic impedance of the back surface of the speaker unit 1 is reduced. Therefore, the impedance load can be substantially equal to the load of pure resistance. Consequently, a high-quality reproduced sound having less disturbance in the relative time relationship among element waveforms constituting a musical sound can be obtained.

Moreover, the cushioning member 8 is secured at the midpoint between the magnet 2 and the fixing pedestal 12. Thus, a vibration mode of mechanical vibration transmitted from the diaphragm 4 to the support bar 7 through the magnet 2 can be simplified. Therefore, deterioration of sound quality resulting from longitudinal waves and transverse waves can be effectively prevented.

Moreover, the speaker housing 10 is allowed to stand upright, and thus the front surface of the speaker unit 1 is directed upward. As a result, horizontal directivity about the sound waves from the speaker unit 1 can have an angle of 360 degrees. Consequentlky, the coverage area for listening can be remarkably increased. In addition, reproducibility of the sound field space can be improved.

Furthermore, the speaker housing 10 has a cylindrical shape and has no flat portion. Thus, little vibration is generated by the sound waves radiated from the back surface of the speaker unit 1. Therefore, the material of the speaker housing 10 has little influence on the sound quality. Thus, the material of the housing can be selected with a high degree of flexibility so as to give priority to the design thereof. Accordingly, transparent resin, glass or the like can be used as the material of the housing.

A method of supporting the above-mentioned speaker unit 1 is not limited to a method of the above-described second preferred embodiment in which the speaker unit 1 is supported by the support bar 7 and the fixing pedestal 12. The following method may be adopted. That is, the support bar 7 is cut at any position between the cushioning member 8 fixed at the midpoint in the support bar 7 and the opening 10*c* of the speaker housing 10, and the speaker unit 1 is supported by using an appropriate support member in such a manner that the opening 10*c* of the speaker housing 10 is separated from the ground G.

Figure 9:
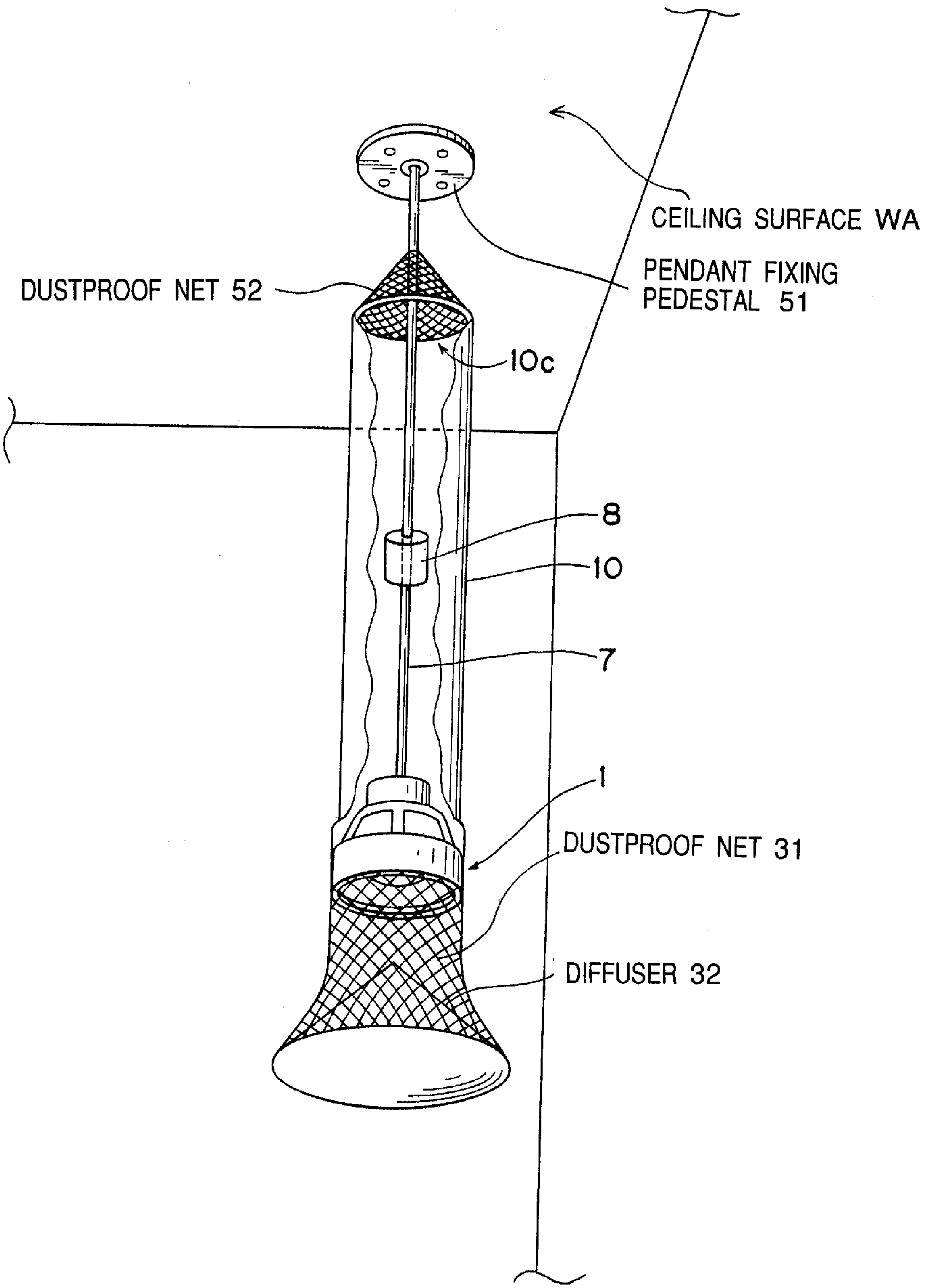
FIG. 9 is a partially broken perspective view of a configuration of a speaker apparatus of a fourth modified preferred embodiment according to the present invention, which is a modified preferred embodiment of the second preferred embodiment.

The speaker housing 10 is not supported at the position under the speaker housing 10. It may be suspended and supported at the position above the speaker housing 10, such as a ceiling surface WA, as shown in FIG. 9 illustrating a fourth modified preferred embodiment. In the fourth modified preferred embodiment, the conical diffuser 32 is mounted to the lower speaker unit 1 through the dustproof net 31, in a manner similar to that of the first preferred embodiment. Further, a conical dustproof net 52 is mounted to the upper opening 10*c* and an upper end of the support bar 7 is fixed to the ceiling surface WA by using a pendant fixing pedestal 51.

When the speaker unit 1 and so on are supported by any one of the above-described methods, the weight of the cushioning member 8 may be increased so as to be heavier than the weight of the speaker unit 1. Thus, the cushioning member 8 may function as the virtual ground so that the cushioning member 8 can sufficiently absorb vibration or oscillation of the speaker unit 1.

Figure 10:
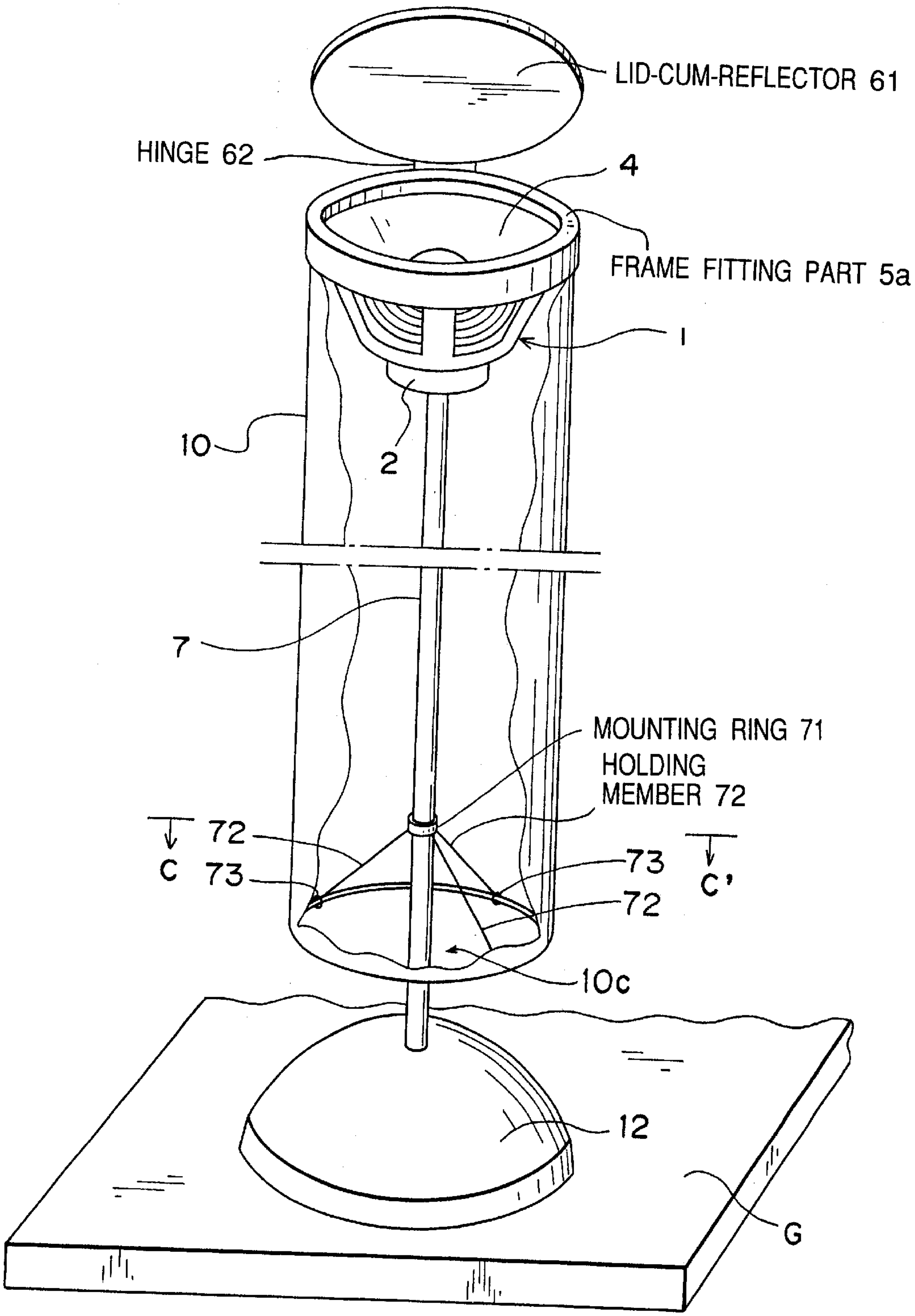
FIG. 10 is a partially broken perspective view of a configuration of a speaker apparatus of a fifth modified preferred embodiment according to the present invention, which is another modified preferred embodiment of the second preferred embodiment.
Figure 11:
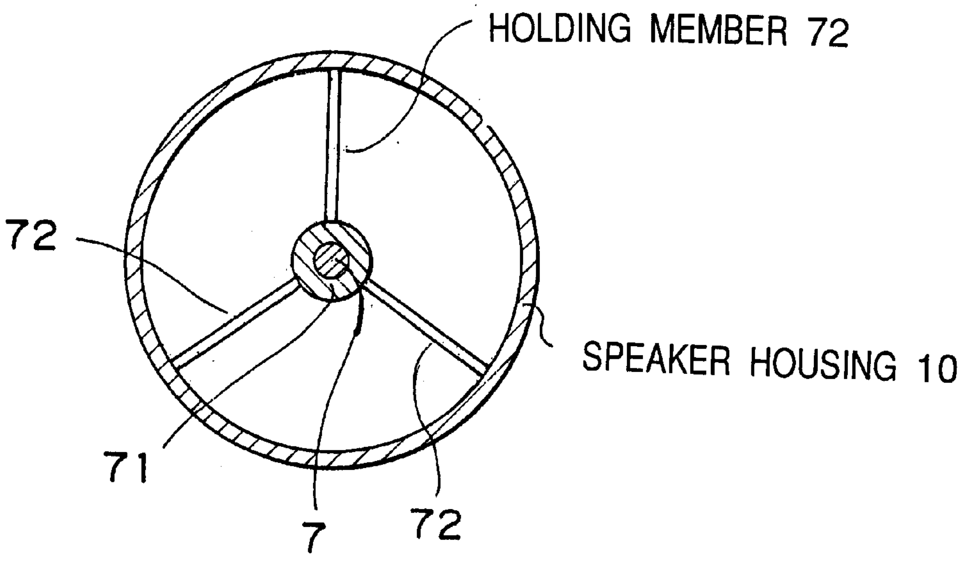

FIG. 10 is a partially broken perspective view of a configuration of a speaker apparatus of a fifth modified preferred embodiment according to the present invention, which is another modified preferred embodiment of the second preferred embodiment. FIG. 11 is a longitudinal sectional view taken along line C-C' of FIG. 10, and a transverse sectional view of a part of the speaker housing 10 which holding members 72 shown in FIG. 10 are fitted to.

Referring to FIG. 10, a lid-cum-reflector 61 is fitted to a frame fitting part 5*a* by a hinge 62. The lid-cum-reflector 61 substantially transversely or horizontally reflects and diffuses the sound waves, which are radiated upward from the speaker unit 1. Thus, the sound waves can be radiated over a wide area of about 180 degrees except for the position or location where the lid-cum-reflector 61 is located.

Referring to FIGS. 10 and 11, a mounting ring 71 is mounted and fixed to the support bar 7 at the lower portion of the support bar 7 and at the position slightly higher than the opening 10*c*. At least three holding members 72, each of which has a shape of yarn and is made of, for example, reinforced nylon or Tetron™, extending from the mounting ring 71, and are tied 73 to the opening 10*c* at the positions spaced by 120 degrees with respect to each other. Thus, the support bar 7 is held at a predetermined position (preferably, the position of the axis) in the speaker housing 10.

Modified Preferred Embodiments

Figure 12:
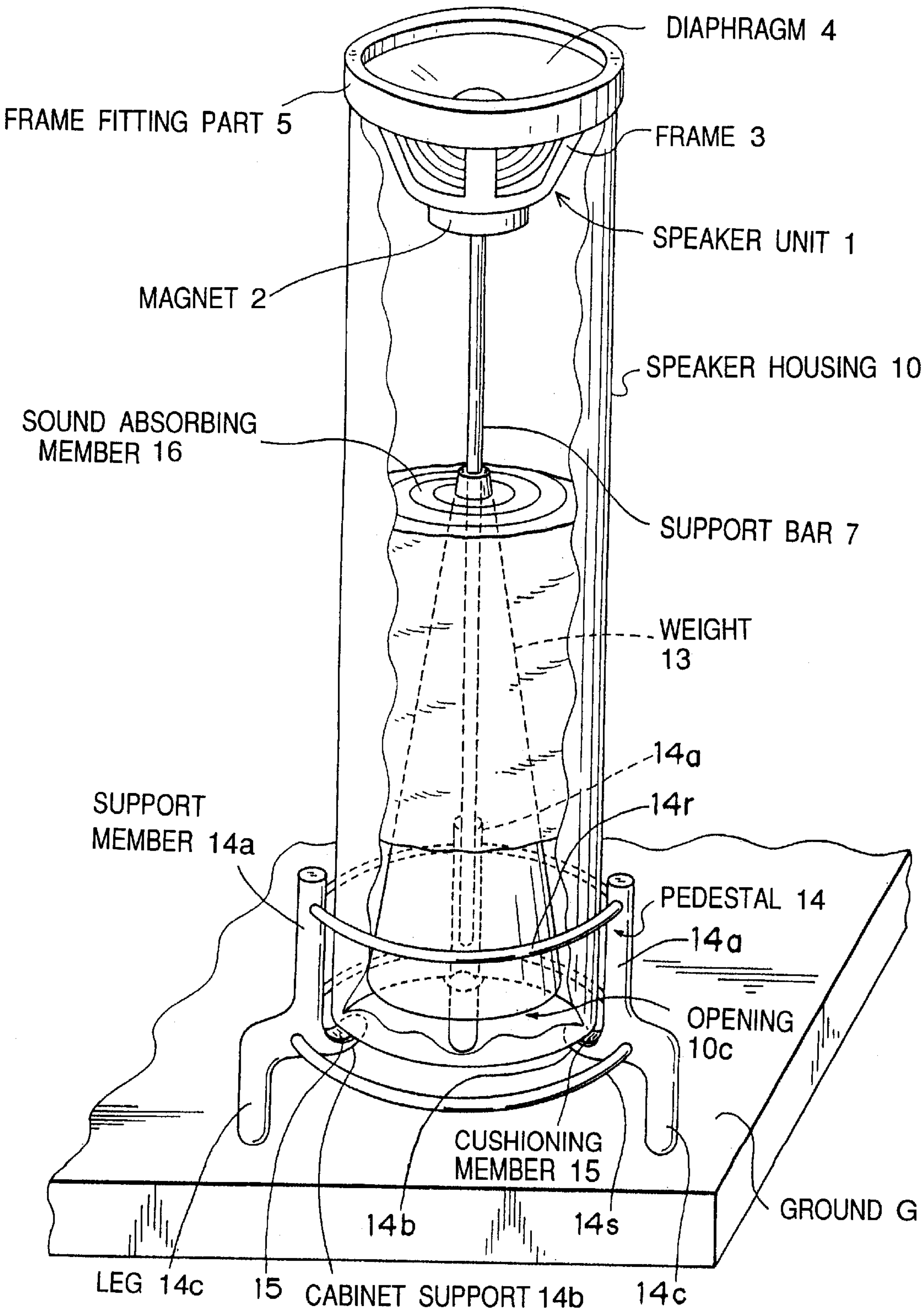
FIG. 12 is a partially broken perspective view of a configuration of a speaker apparatus of a sixth modified preferred embodiment according to the present invention, which is a further modified preferred embodiment of the first preferred embodiment.

FIG. 12 is a partially broken perspective view of a configuration of a speaker apparatus of a sixth modified preferred embodiment according to the present invention, which is a further modified preferred embodiment of the first preferred embodiment. As compared with the first preferred embodiment, as shown in FIG. 12, the sixth modified preferred embodiment is characterized by the followings:

(1) a substantially conical weight 13*a*, instead of the spherical weight 13, is provided at the lower portion of the support bar 7; and (2) a sound absorbing member 16, made of glass wool or felt filled therein in a cylindrical shape and made of like cotton, is provided around a part of a conical surface of the weight 13*a* and between the conical surface of the weight 13*a* and the inner surface of the speaker housing 10.

The diameter of the end surface of the substantially conical weight 13*a* is set so as to be smaller than the inner diameter of the speaker housing 10. Thus, the diameter of the end surface of the weight 13*a* is set so that the weight 13*a* is not brought into contact with the speaker housing 10 even if the weight 13*a* is slightly vibrated or osciallated. In the modified preferred embodiment, the weight 13*a* conically extended from the upper position of the support bar 7 toward the opening 10*c* and is mounted to the support bar 7 so as to function as the weight for forming the virtual ground. The advantageous effects of the weight 13*a* are as follows:

(1) disturbance in the sound waves radiated from the back surface of the diaphragm 4 can be reduced or suppressed in the speaker housing 10 since the weight 13*a* is tapered;

(2) the center of gravity of the weight 13*a* can be lowered, and thus stability of upright standing of the speaker housing 10 can be increased; and (3) the sound absorbing member 16 can be easily mounted around the weight 13*a* so as not to fall downward.

Figure 13:
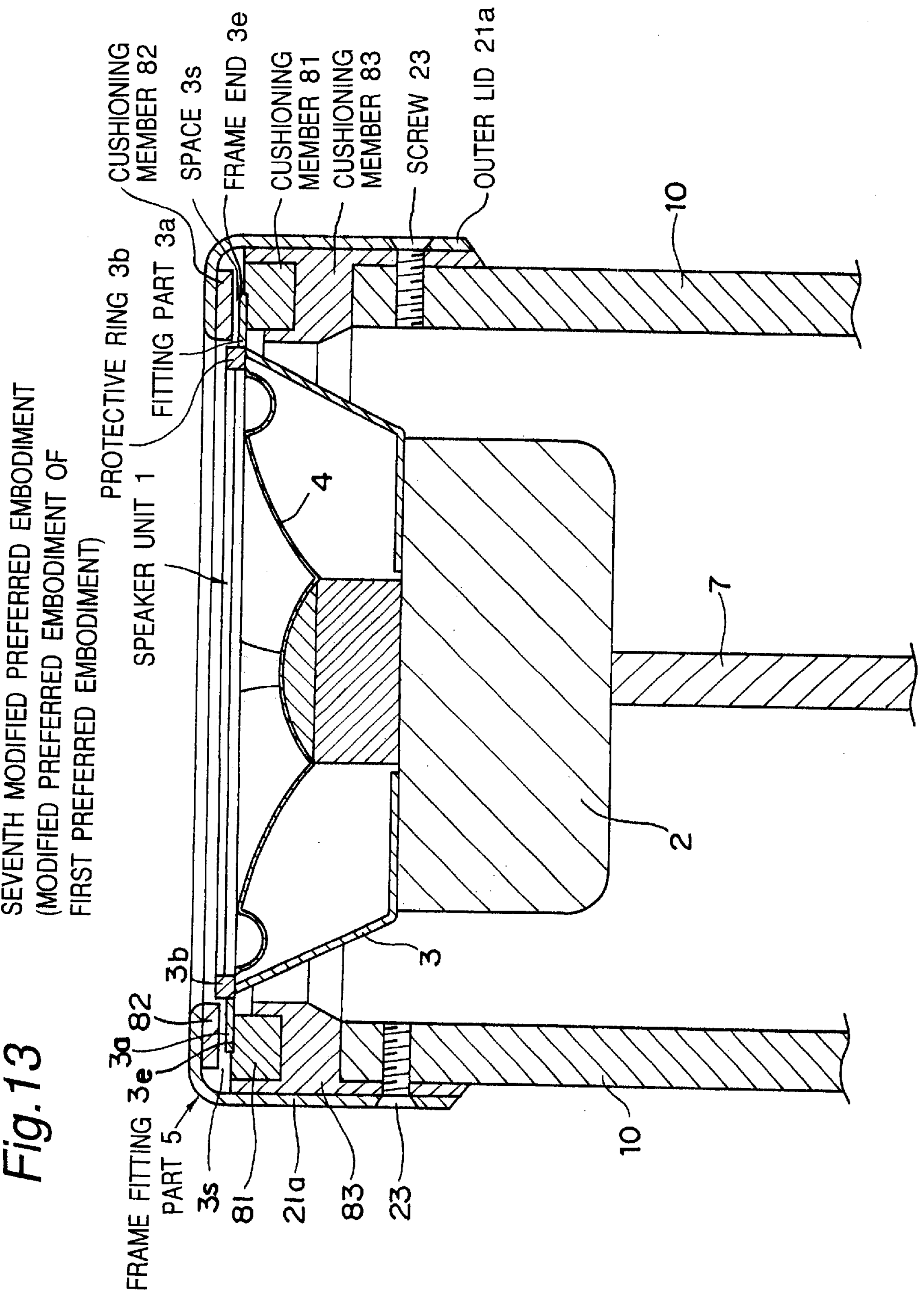
FIG. 13 is a longitudinal sectional view of a configuration of a speaker apparatus of a seventh modified preferred embodiment according to the present invention, which is a still further modified preferred embodiment of the first preferred embodiment.

FIG. 13 is a longitudinal sectional view of a configuration of a speaker apparatus of a seventh modified preferred embodiment according to the present invention, which is a further modified preferred embodiment of the first preferred embodiment. FIG. 13 shows a modified preferred embodiment of the frame fitting part 5 shown in FIG. 2. Differences between the frame fitting parts 5 shown in FIGS. 13 and 2 are as follows.

Instead of the mounting member 21, a cylindrical outer lid 21*a* having the top end surface and having a hole formed in the center thereof is mounted and fixed to the speaker housing 10 by the screw 23 through a cushioning member 83. A cushioning member 81 for receiving a frame end 3*e* of the frame 3 is fitted and bonded onto the cushioning member 83 having a shape for mounting or receiving the cushioning member 81 thereon, fitting the cushioning member 81 thereinto and fixing the cushioning member 81, so that the cushioning member 81 is fixed to the cushioning member 83. A cushioning member 82 is bonded under the top end surface of the outer lid 21*a*. There is a space 3*s* between the frame end 3*e* and the cushioning member 82. A member indicated by reference numeral 3*b* is called "yagami (arrow paper)", and is a protective ring projected from the front surface of the frame 3 of the speaker unit 1. An inner periphery of the upper end surface of the above-mentioned outer lid 21*a* is set so as to be larger than an outer periphery of the protective ring 3*b*. The frame end 3*e* is pulled in the vertical direction by gravity by the weight 13. The cushioning member 82 has a function of cushioning the frame end 3*e* from a direct contact with the outer lid 21*a* at the time of movement of the speaker apparatus. The cushioning members 81, 82 and 83 are made of, for example, urethane or θ gel™.

Figure 14:
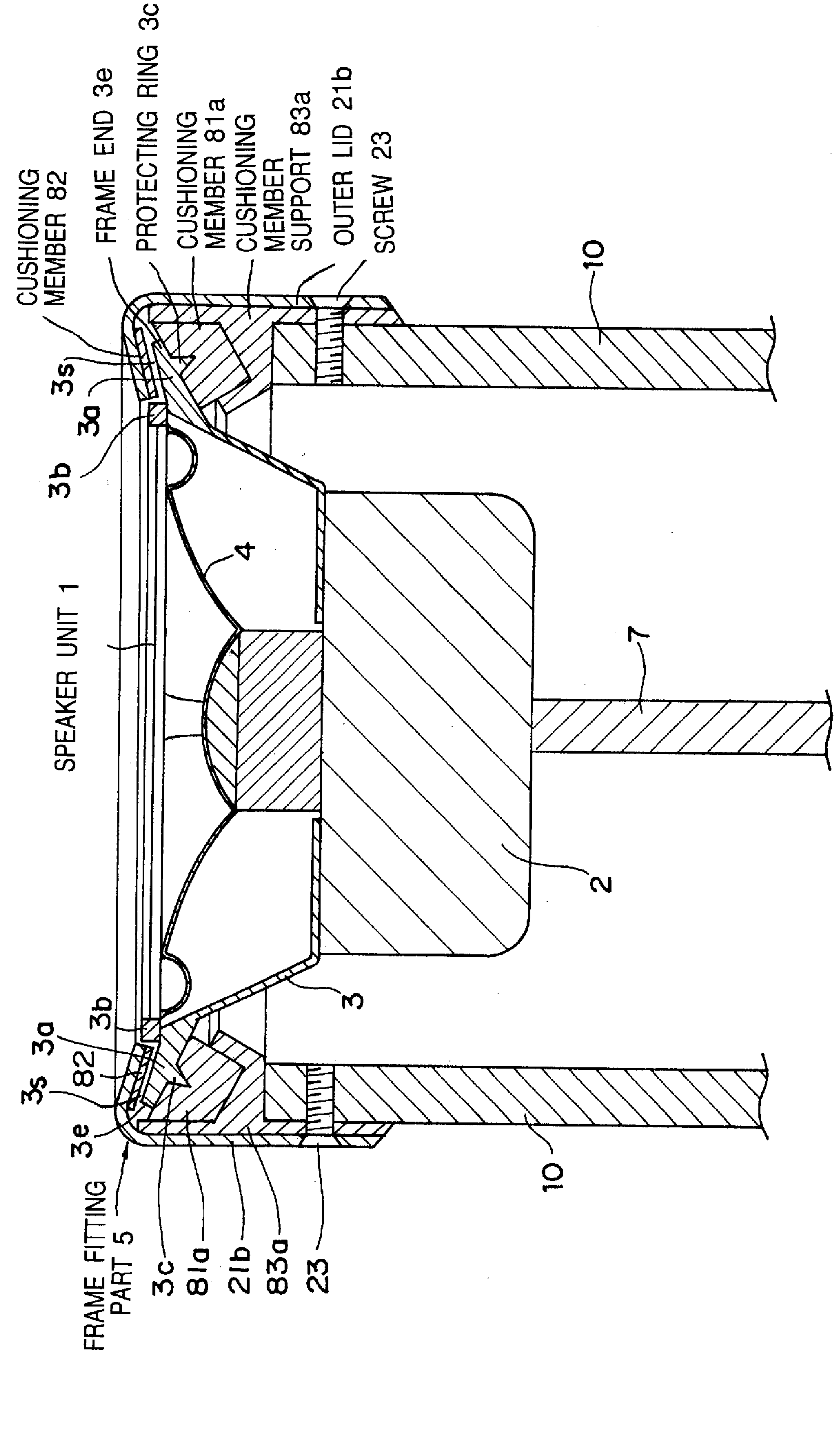
FIG. 14 is a longitudinal sectional view of a configuration of a speaker apparatus of an eighth modified preferred embodiment according to the present invention, which is still further modified preferred embodiment of the first preferred embodiment.
Figure 15:
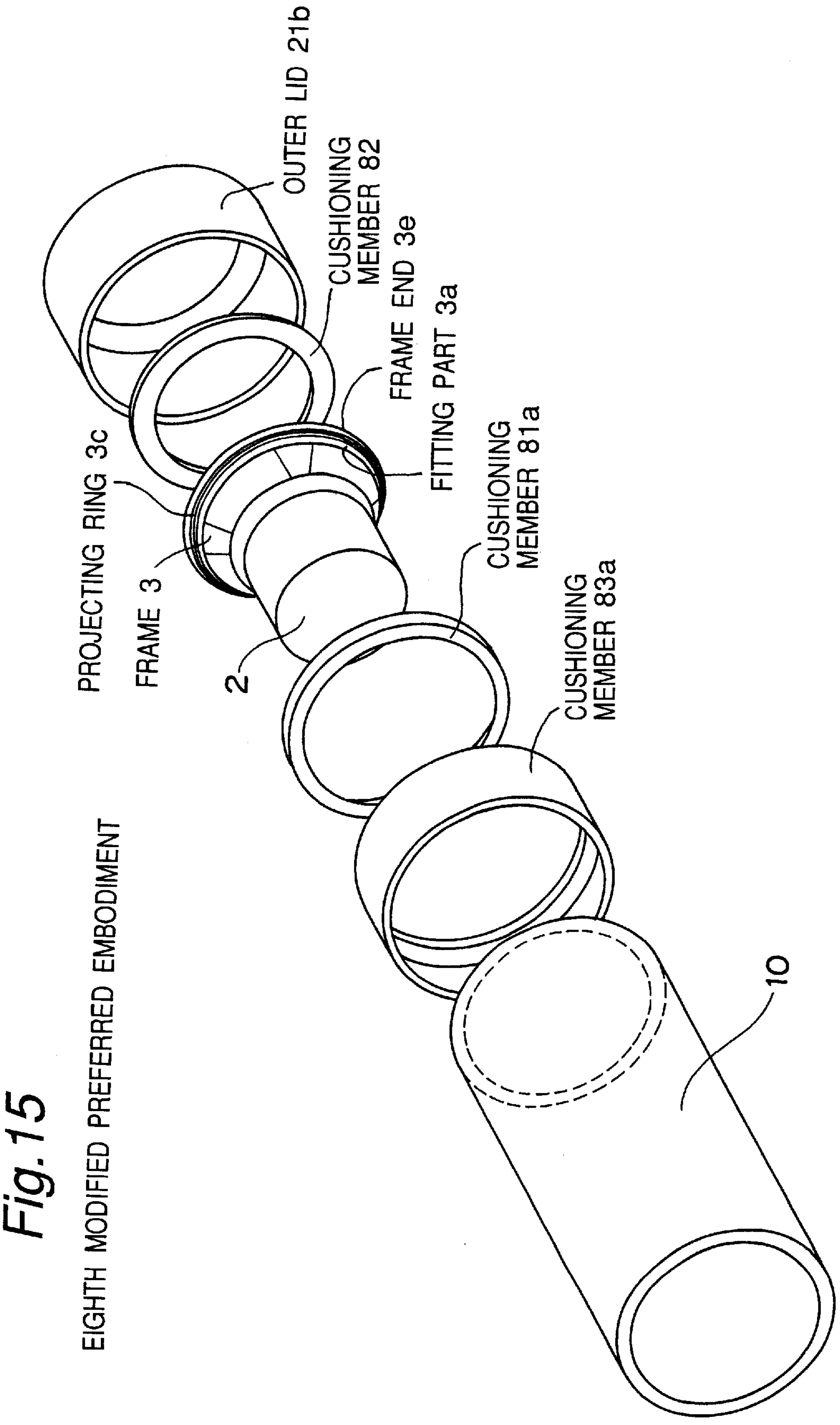
FIG. 15 is an exploded perspective view of components of the speaker apparatus shown in FIG. 14.

FIG. 14 is a longitudinal sectional view of a configuration of a speaker apparatus of an eighth modified preferred embodiment according to the present invention, which is a further modified preferred embodiment of the first preferred embodiment. FIG. 15 is an exploded perspective view of components of the speaker apparatus shown in FIG. 14.

In the frame fitting part 5 according to the first preferred embodiment shown in FIG. 2, the speaker unit 1 is horizontally mounted on the cushioning member 22 horizontally held by the top surface of the cylinder of the speaker housing 10 and an inside surface of the mounting member 21. In the eighth modified preferred embodiment shown in FIG. 14, the speaker unit 1, which has such a structure that a lower surface of the fitting part 3*a* of the frame 3 is inclined by about 30 degrees from the vertical direction, is brought into surface contact with a cushioning member 81*a* whose top surface is inclined by about 30 degrees inward from the vertical direction (which is the vertical direction in FIG. 14), so that the speaker unit 1 is horizontally held. The cushioning member 81*a* is mounted and fixed by an outer lid 21*b* through a cushioning member 83*a*. Thus, the centripetal force toward the center axis is exerted onto the frame end 3*e* of the speaker unit 1. As a result, the speaker unit 1 can be horizontally held about the center axis thereof with an oscillating surface of the diaphragm 4 directed upward (with the cylindrical speaker housing 10 installed in the vertical direction, namely, so that the axis direction of the cylindrical speaker housing is parallel to the vertical direction).

Furthermore, in order to strengthen a center holding force against the movement or the like of the cylindrical speaker housing 10, a projecting ring 3*c* having a triangular shape in the cross section and extending from the lower surface of the fitting part 3*a* of the frame 3 toward the cushioning member 81*a* substantially perpendicularly to the lower surface is formed at the midpoint position on a circumferential surface, on which the lower surface of the fitting part 3*a* of the speaker unit 1 is in surface contact with the cushioning member 81*a*. With the projecting ring 3*c* which is press-fitted into the cushioning member 81*a*, the lower surface of the fitting part 3*a* of the frame 3 is in such a state as in contact with the top surface of the cushioning member 81*a*. Thus, shift or displacement of the speaker unit 1 can be prevented even when the cylindrical speaker housing 10 is inclined. Even if a slight shift is caused, the speaker unit 1 is restored to its original position by the center holding force combined with the above-mentioned centripetal force when the cylindrical speaker housing 10 is restored to a vertical position. Therefore, the precise center axis can be held.

Figure 16:
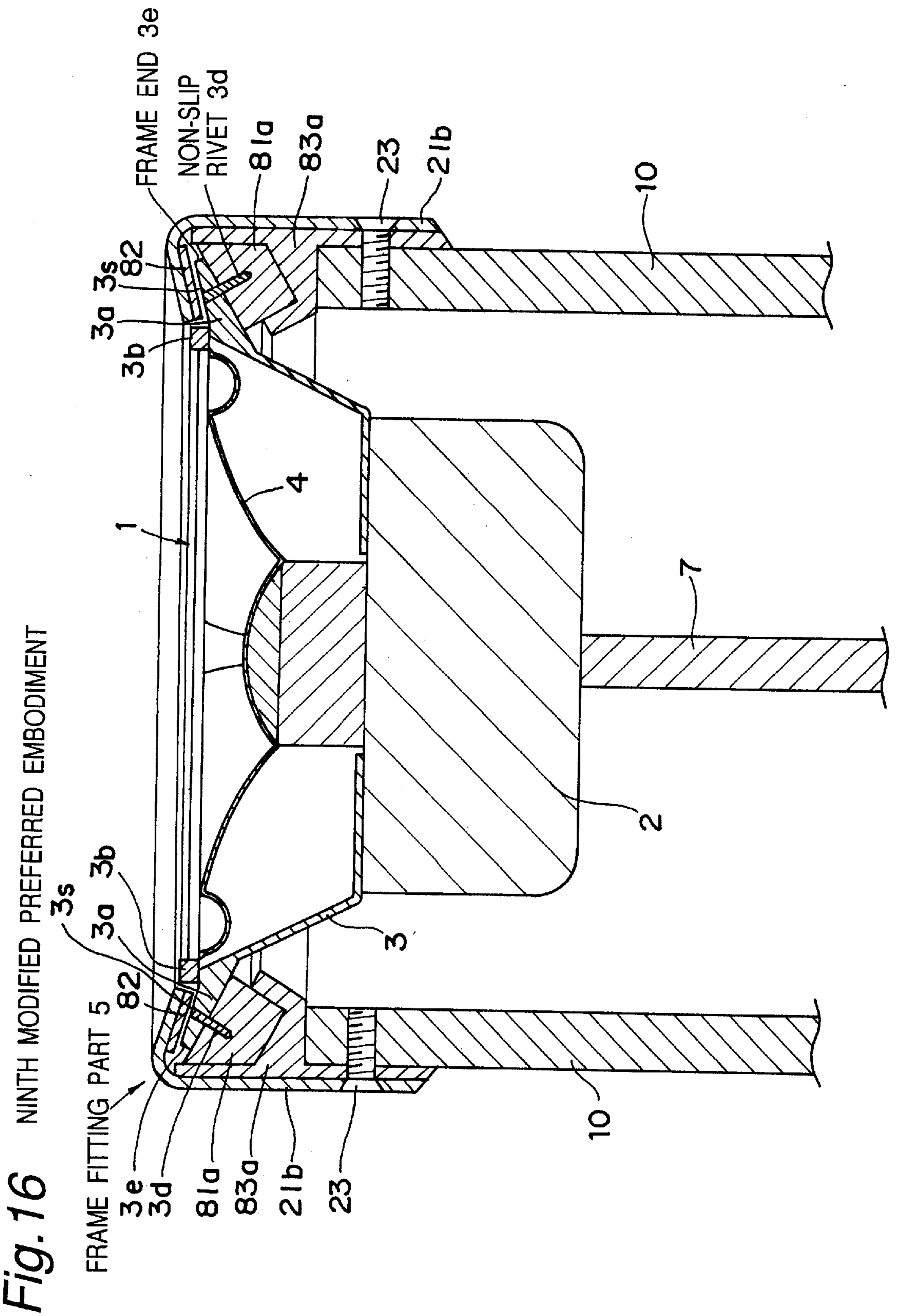
FIG. 16 is a longitudinal sectional view of a configuration of a speaker apparatus of a ninth modified preferred embodiment according to the present invention, which is a further modified preferred embodiment of the first preferred embodiment.
Figure 17:
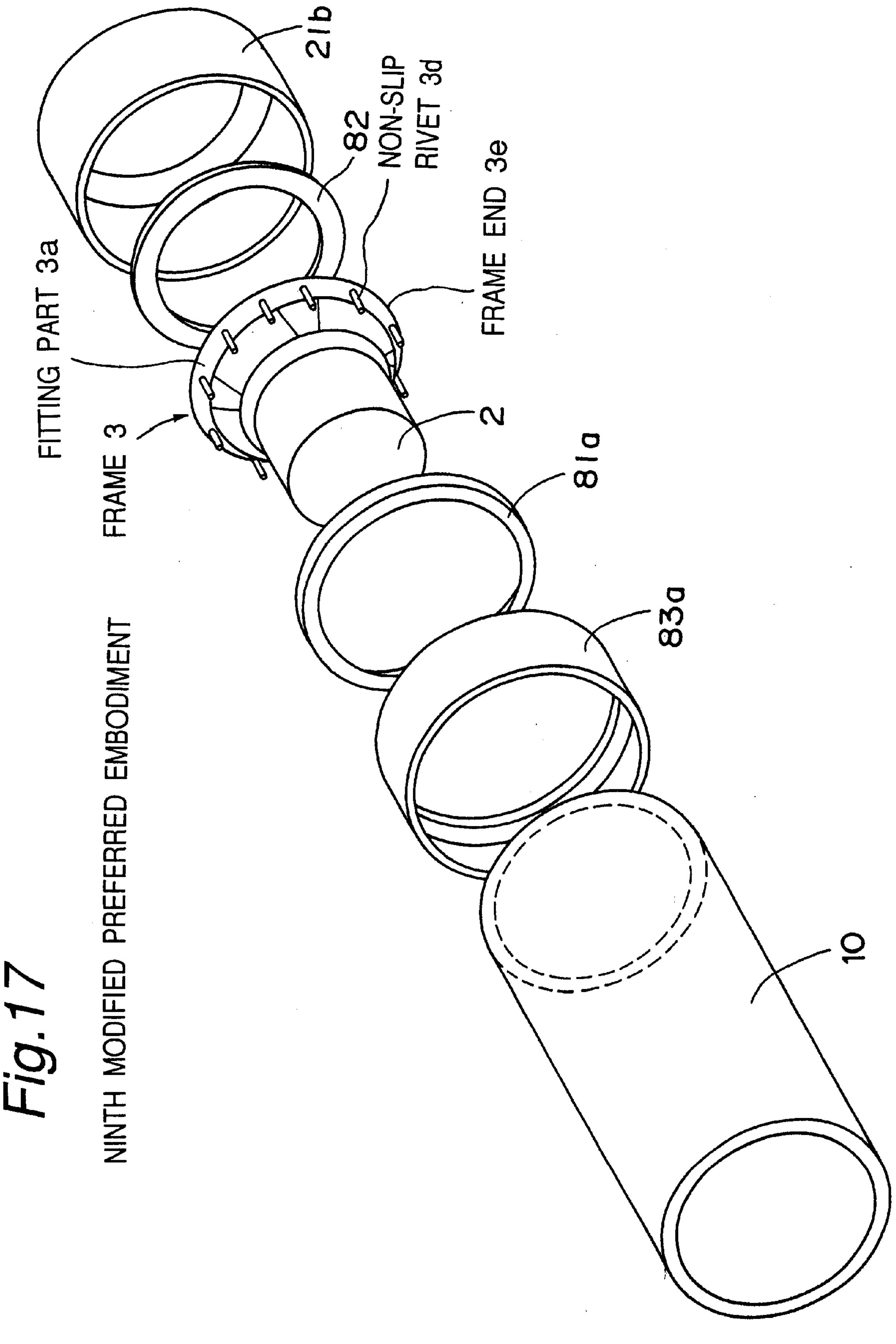
FIG. 17 is an exploded perspective view of components of the speaker apparatus shown in FIG. 16.

FIG. 16 is a longitudinal sectional view of a configuration of a speaker apparatus of a ninth modified preferred embodiment according to the present invention, which is a further modified preferred embodiment of the first preferred embodiment. FIG. 17 is an exploded perspective view of components of the speaker apparatus shown in FIG. 16.

In the ninth modified preferred embodiment, the projecting ring 3*c* for preventing slip shown in FIG. 14 is replaced by a plurality of non-slip rivets 3*d*. A projection of the non-slip rivet 3*d* is press-fitted into and brought into contact with the cushioning member 83*a*, and this leads to the prevention of shift or displacement of the speaker unit and thus the center axis is held. A portion of the non-slip rivet 3*d* close to the fitting part 3*a* of the frame 3 is screwed into and thus fixed to the fitting part 3*a* of the frame 3.

Figure 18:
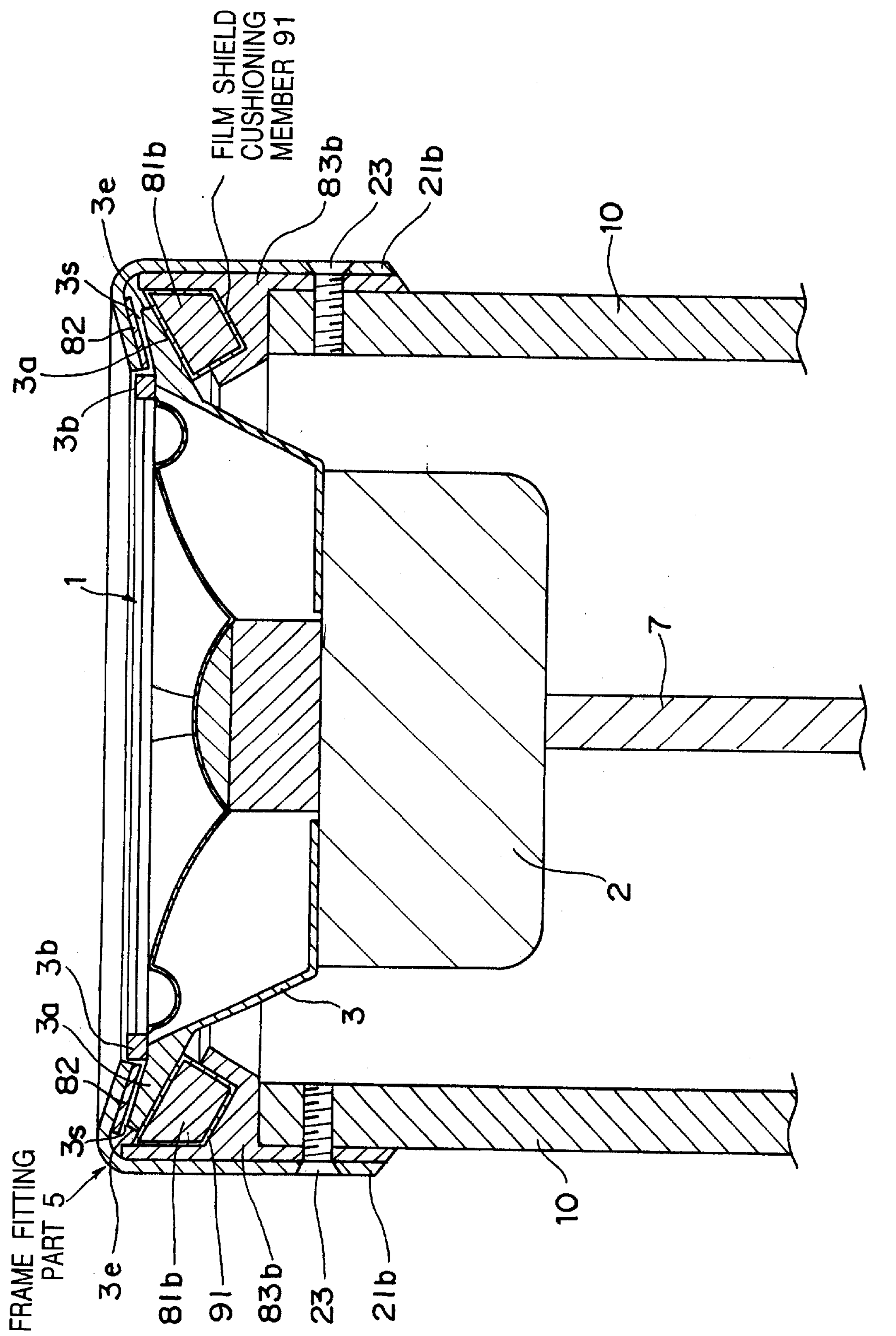
FIG. 18 is a longitudinal sectional view of a configuration of a speaker apparatus of a tenth modified preferred embodiment according to the present invention, which is a further modified preferred embodiment of the first preferred embodiment.
Figure 19:
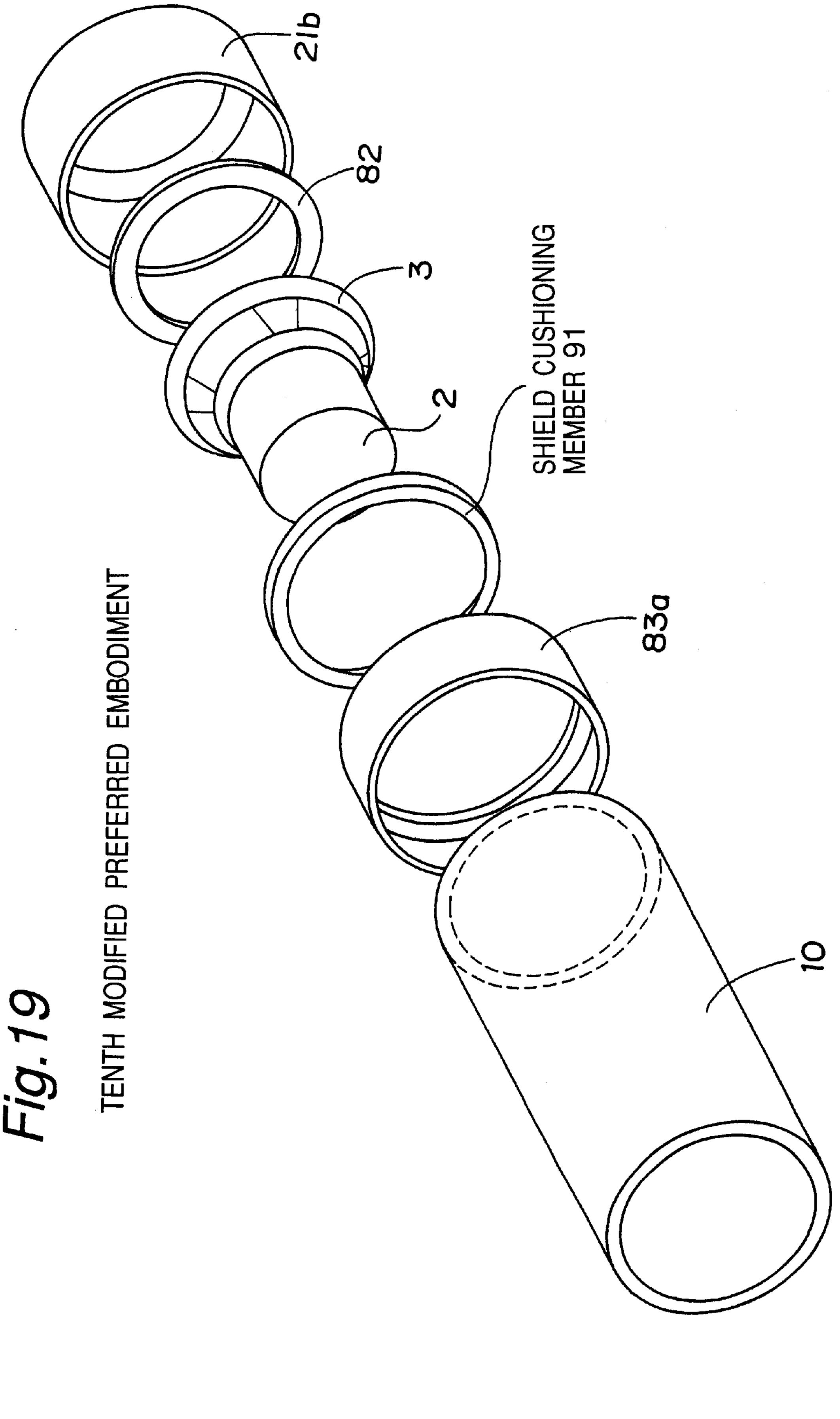
FIG. 19 is an exploded perspective view of components of the speaker apparatus shown in FIG. 18.

FIG. 18 is a longitudinal sectional view of a configuration of a speaker apparatus of a tenth modified preferred embodiment according to the present invention, which is a further modified preferred embodiment of the first preferred embodiment. FIG. 19 is an exploded perspective view of components of the speaker apparatus shown in FIG. 18.

In the tenth modified preferred embodiment, the non-slip rivets 3*d* according to the ninth modified preferred embodiment shown in FIG. 16 are eliminated, and a film shield cushioning member 91 having a film made of resin such as polyester or polypropylene is wound around a cushioning member 81*b* made of θ gel™ having a stickness or adherence. Thus, a contact surface, on which the lower surface of the fitting part 3*a* of the frame 3 is in contact with the cushioning member 81*b*, is made slippery. Even if the cylindrical speaker housing 10 is inclined and thus the center axis of the speaker unit 1 is shifted, the centripetal force toward the center axis generated on the contact surface allowing the speaker unit 1 to be restored to a horizontal position when the speaker housing 10 is restored to the vertical position, so that the center axis of the speaker unit 1 and the speaker housing 10 can be held.

Figure 20:
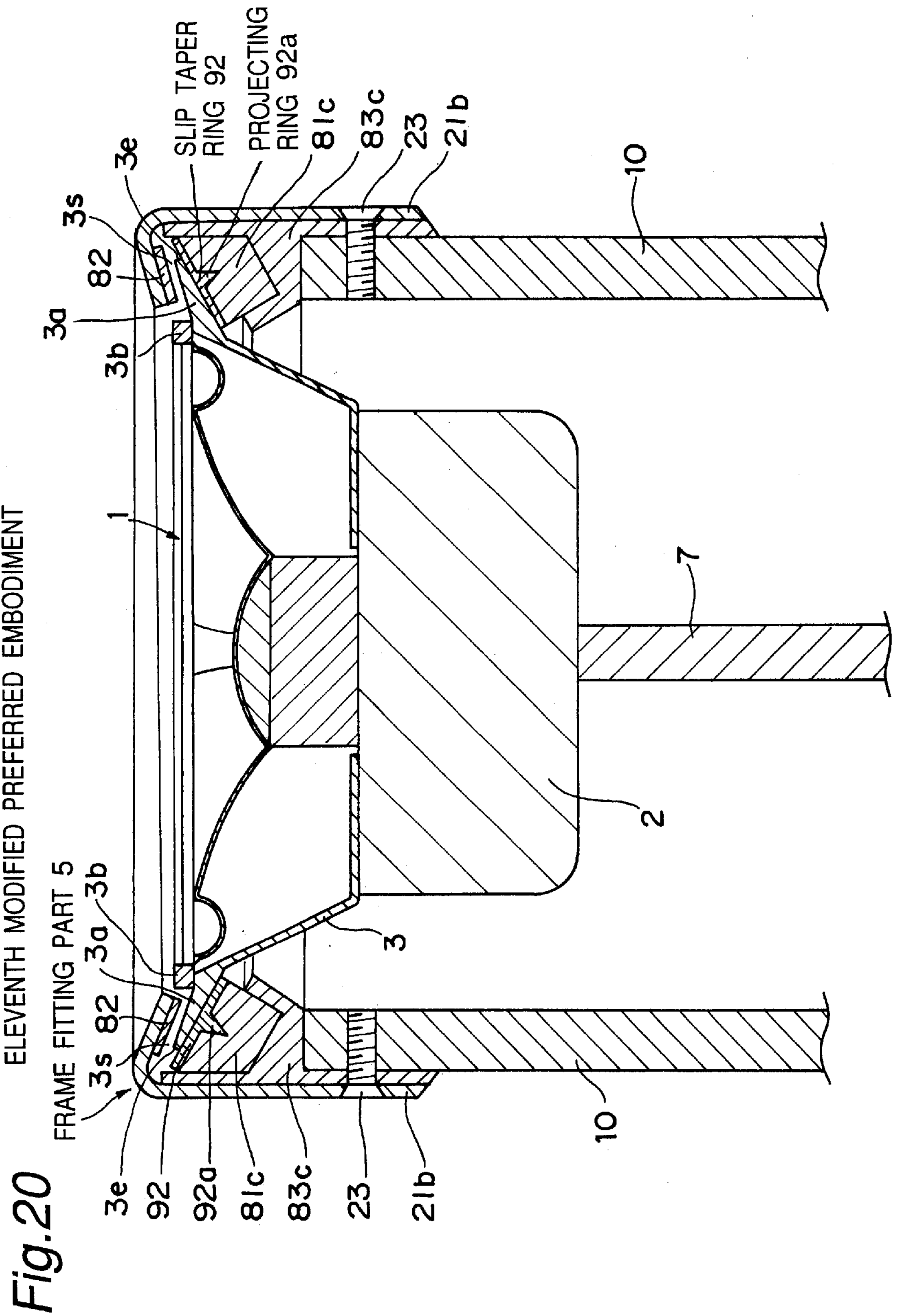
FIG. 20 is a longitudinal sectional view of a configuration of a speaker apparatus of an eleventh modified preferred embodiment according to the present invention, which is a further modified preferred embodiment of the first preferred embodiment.

FIG. 20 is a longitudinal sectional view of a configuration of a speaker apparatus of an eleventh modified preferred embodiment according to the present invention, which is a further modified preferred embodiment of the first preferred embodiment.

In the eleventh modified preferred embodiment, instead of the film shield cushioning member 91 wound around the cushioning member 81*b* according to the tenth modified preferred embodiment shown in FIG. 18, a slip taper ring 92 having the same projecting ring 92*a* as that shown in FIG. 14 (the projecting ring 92*a* may be replaced with the non-slip rivets shown in FIGS. 16 and 17) is mounted on a cushioning member 81*c* and on the lower surface of the tapered fitting part 3*a* made of a slippery material such as Teflon™ or Duracon™, so that the projecting ring 92*a* is press-fitted into the cushioning member 81*c*. In this case, shift or displacement of the speaker unit 1 can be prevented even when the cylindrical speaker housing 10 is inclined. Even if a slight shift or displacement occurs, the speaker unit 1 is restored to its original position by the center holding force, as combined with the above-mentioned centripetal force when the cylindrical speaker housing 10 is restored to the vertical position. Accordingly, the precise center axis can be held.

Figure 21:
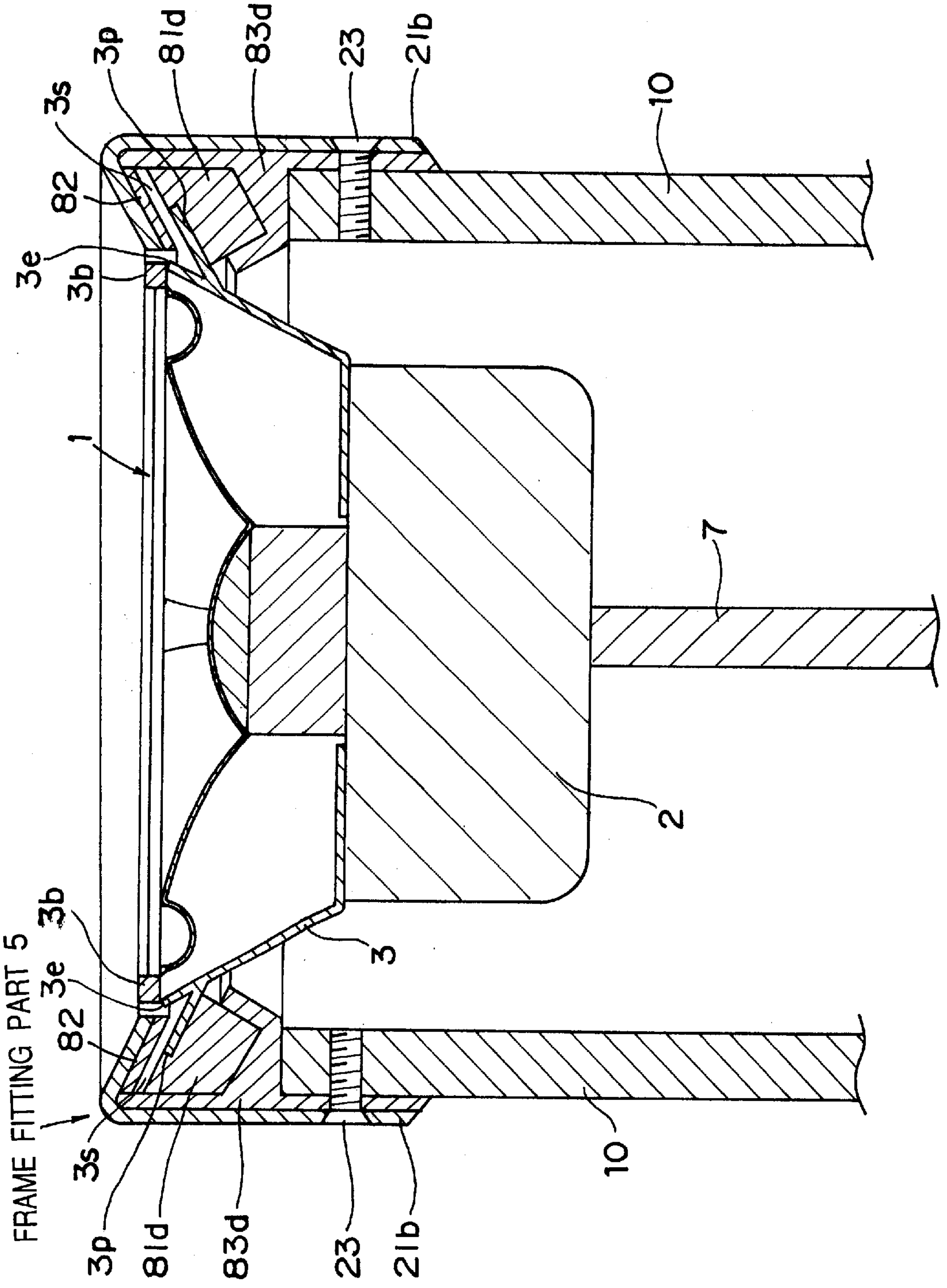
FIG. 21 is a longitudinal sectional view of a configuration of a speaker apparatus of a twelfth modified preferred embodiment according to the present invention, which is a further modified preferred embodiment of the first preferred embodiment.

FIG. 21 is a longitudinal sectional view of a configuration of a speaker apparatus of a twelfth modified preferred embodiment according to the present invention, which is a further modified preferred embodiment of the first preferred embodiment.

In the twelfth modified preferred embodiment, a frame projection 3*p* having a smaller angle of inclination than the angle of inclination of the frame 3 in the outward direction from the frame 3 is formed so that the frame end 3*e* of the frame 3 of the speaker unit 1 is not moved from its original position. The frame projection 3*p* having the smaller angle of inclination is supported by a cushioning member 81*d*. The cushioning member 81*d* is mounted and fixed by the outer lid 21*b* through a cushioning member 83*d*. Accordingly, the twelfth modified preferred embodiment can more precisely hold the center axis, as compared with the modified preferred embodiment shown in FIG. 18.

Figure 22:
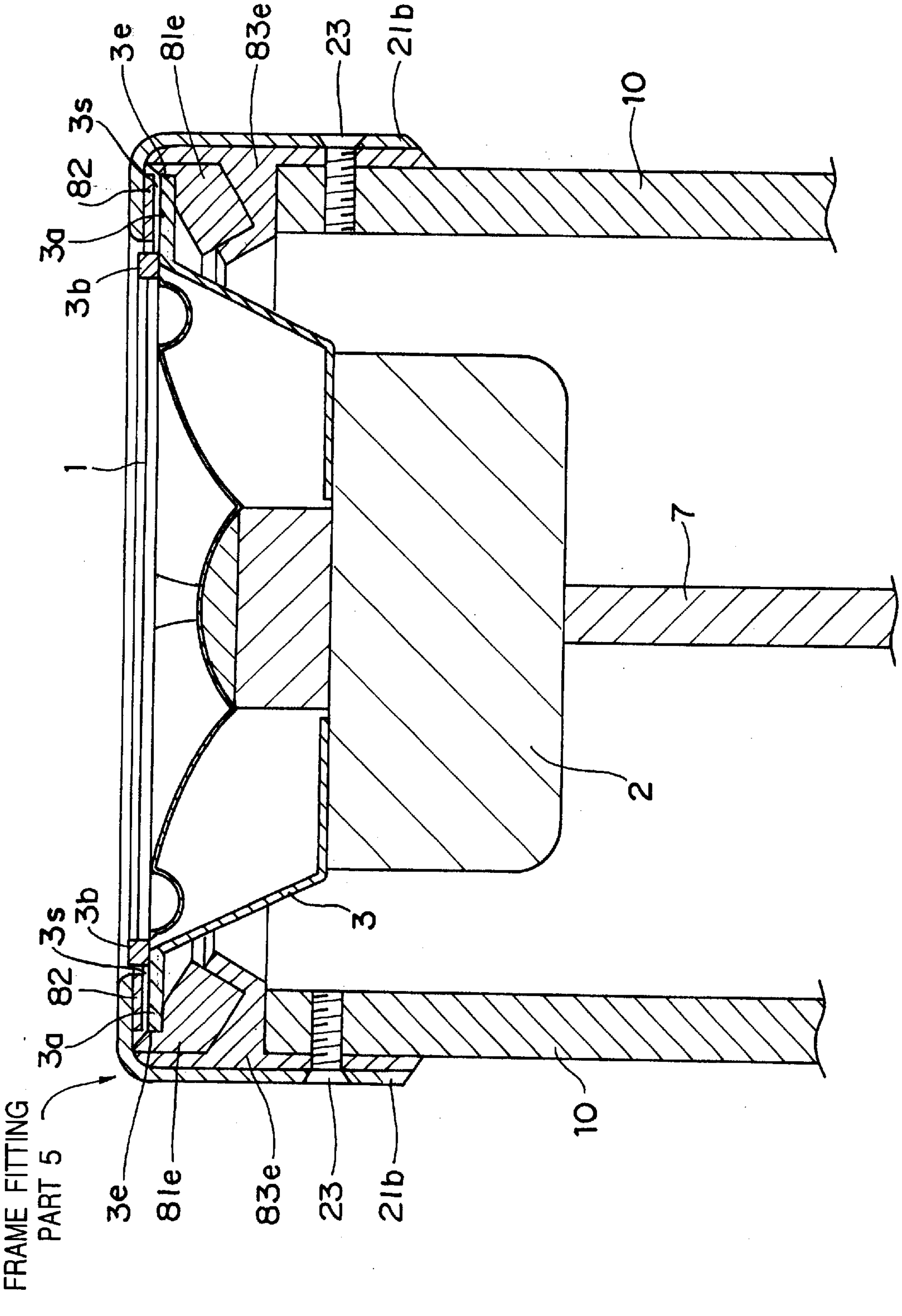
FIG. 22 is a longitudinal sectional view of a configuration of a speaker apparatus of a thirteenth modified preferred embodiment according to the present invention, which is a still further modified preferred embodiment of the first preferred embodiment.

FIG. 22 is a longitudinal sectional view of a configuration of a speaker apparatus of a thirteenth modified preferred embodiment according to the present invention, which is a further modified preferred embodiment of the first preferred embodiment.

The thirteenth modified preferred embodiment has such the simplest structure that the speaker unit 1 is mounted directly on a cushioning member 81*e*. That is, the frame fitting part 3*a* of the frame 3 extends horizontally, and the cushioning member 81*e* has a fitting shape for supporting, mounting and fixing a part of the frame fitting part 3*a* and the frame end 3*e*. The cushioning member 81*e* is mounted and fixed by the outer lid 21*b* through a cushioning member 83*e*. According to the thirteenth modified preferred embodiment, a downward force is exerted on the frame end 3*e* of the speaker unit 1 by the weights of the speaker unit 1, the weight 13 and so on. Thus, the frame end 3*e* is sunk and embedded into the cushioning member 81*e*. Therefore, the speaker unit 1 holds the center axis thereof with high stability.

Figure 23:
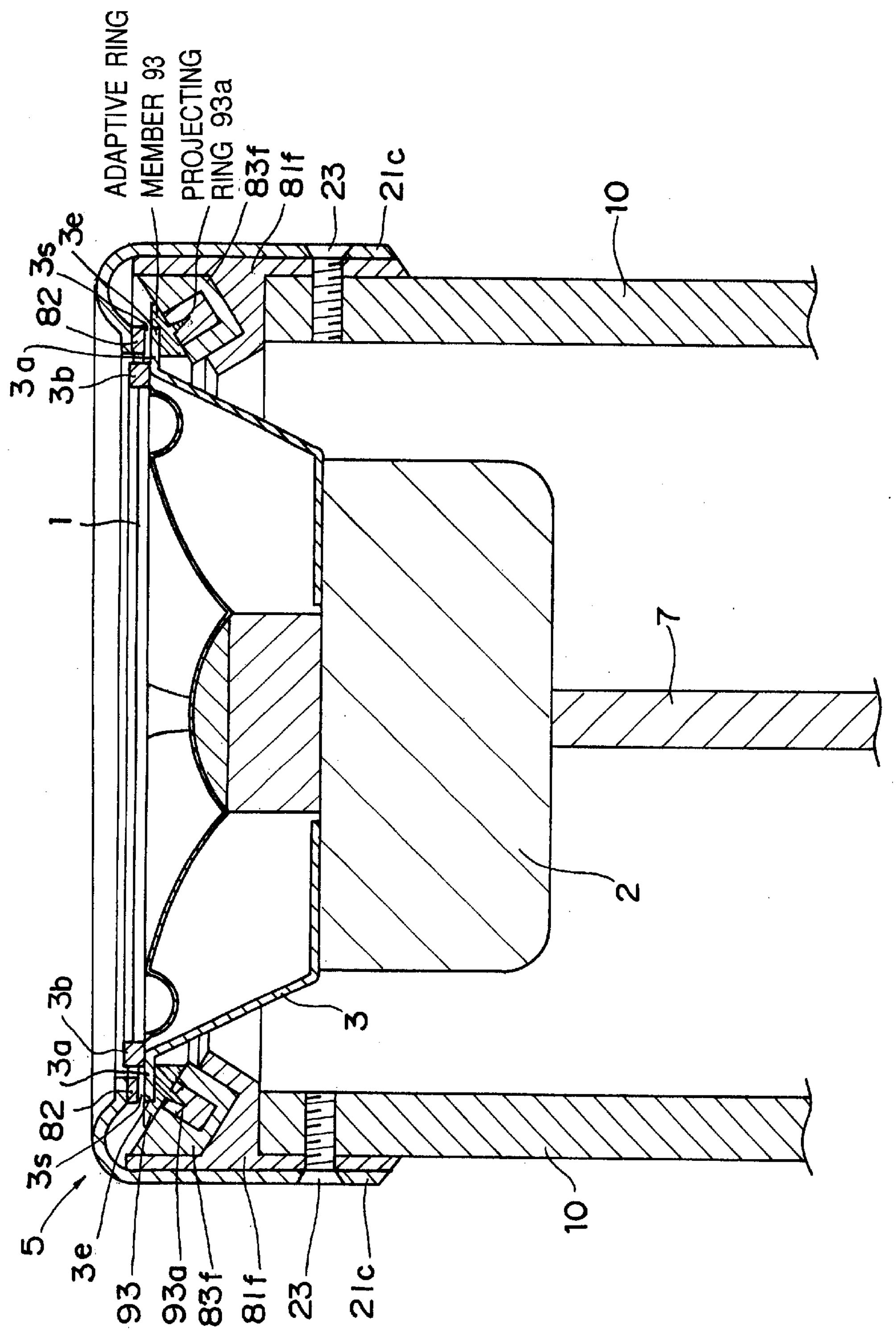
FIG. 23 is a longitudinal sectional view of a configuration of a speaker apparatus of a fourteenth modified preferred embodiment according to the present invention, which is a still further modified preferred embodiment of the first preferred embodiment.
Figures 24A, 24B:
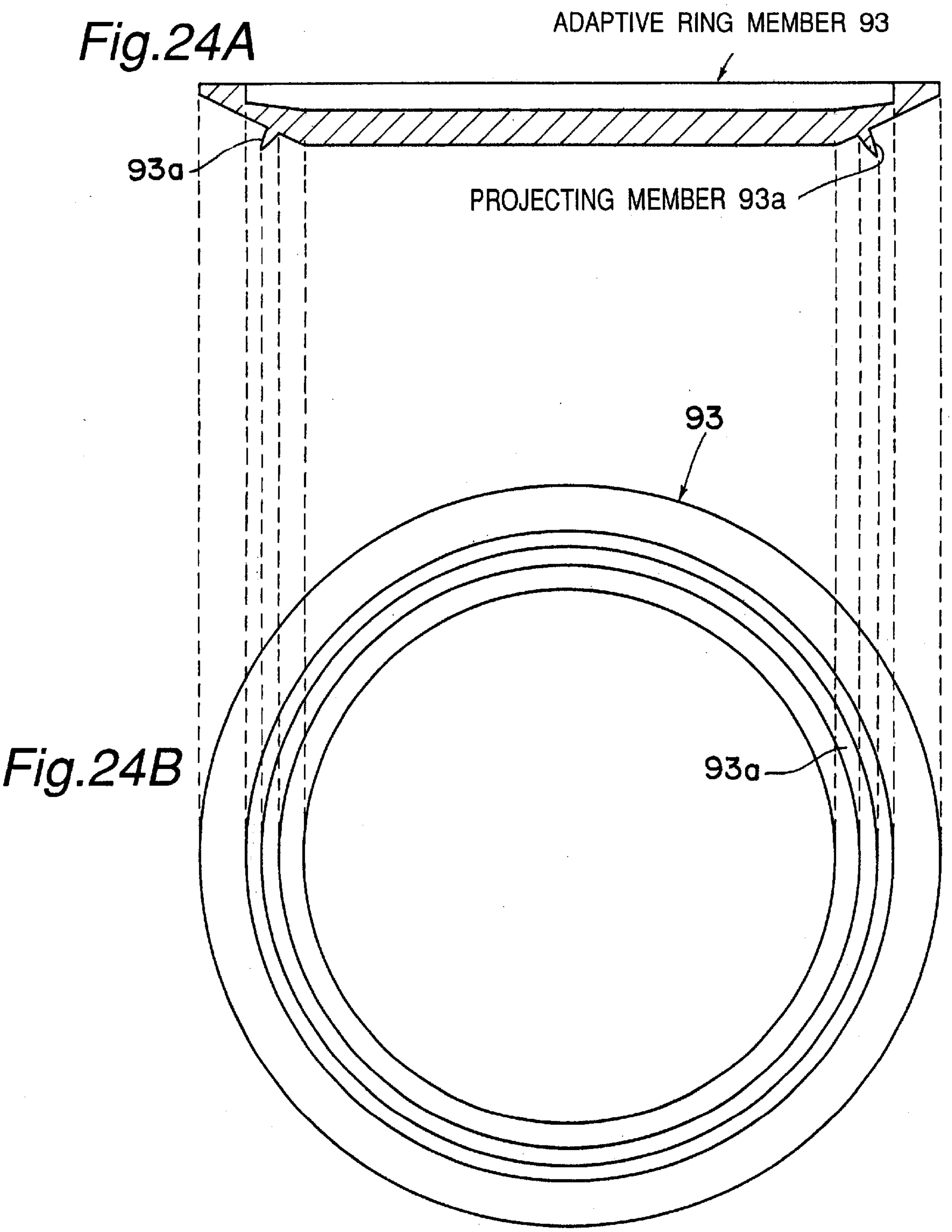
FIGS. 24A and 24B show an adaptive ring member 93 of the speaker apparatus shown in FIG. 23, where

FIG. 23 is a longitudinal sectional view of a configuration of a speaker apparatus of a fourteenth modified preferred embodiment according to the present invention, which is a further modified preferred embodiment of the first preferred embodiment. FIGS. 24A and 24B show an adaptive ring member 93 of the speaker apparatus shown in FIG. 23, where FIG. 24A is a longitudinal sectional view of the adaptive ring member 93, and FIG. 24B is a plan view of the adaptive ring member 93.

In the first and second preferred embodiments and the first to thirteenth modified preferred embodiments, the speaker unit 1 having a generally unavailable special frame structure is used. On the other hand, the fourteenth modified preferred embodiment comprises means for implementing the frame fitting part 5 in the case of the use of a general speaker unit 1.

One method is that the adaptive ring member 93 is interposed between the fitting part 3*a* of the speaker unit 1 and a cushioning member 83*f* in order that the frame 3 having a general shape is adapted to be fitted into the cushioning member 83*f*, as shown in FIG. 23, for example. The material of the adaptive ring member 93 can be a material having a general friction coefficient of, for example, about 0.5, such as acrylonitrile butadiene styrene, i.e., ABS resin, in such a case that the fitting part 3*a* of the frame 3 of the speaker unit 1 is brought into fixed contact with the cushioning member 83*f* (corresponding to the cushioning member 81*a* shown in FIG. 14, the cushioning member 81*a* shown in FIG. 16, and the cushioning member 81*d* shown in FIG. 21), such as the cases of the eighth modified preferred embodiment shown in FIG. 14, the ninth modified preferred embodiment shown in FIG. 16, and the twelfth modified preferred embodiment shown in FIG. 21. However, in such a case that the fitting part 3*a* must be brought into slipper contact with the cushioning member 83*f*, such as the tenth modified preferred embodiment shown in FIG. 18, the eleventh modified preferred embodiment shown in FIG. 20 and the thirteenth modified preferred embodiment shown in FIG. 22, it is desirable to use a material such as Duracon™ or Teflon™ having a friction coefficient of, for example, about 0.2 (Duracon™) or about 0.04 (Teflon™), which is lower than the friction coefficient of ABS resin. As described above, in the fourteenth modified preferred embodiment, the frame fitting part 5 can be implemented when the general speaker unit 1 is used. Teflon™ is made of polytetrafluoroethylene, and Duracon™ is made of polyacetal (POM) resin.

Figure 25:
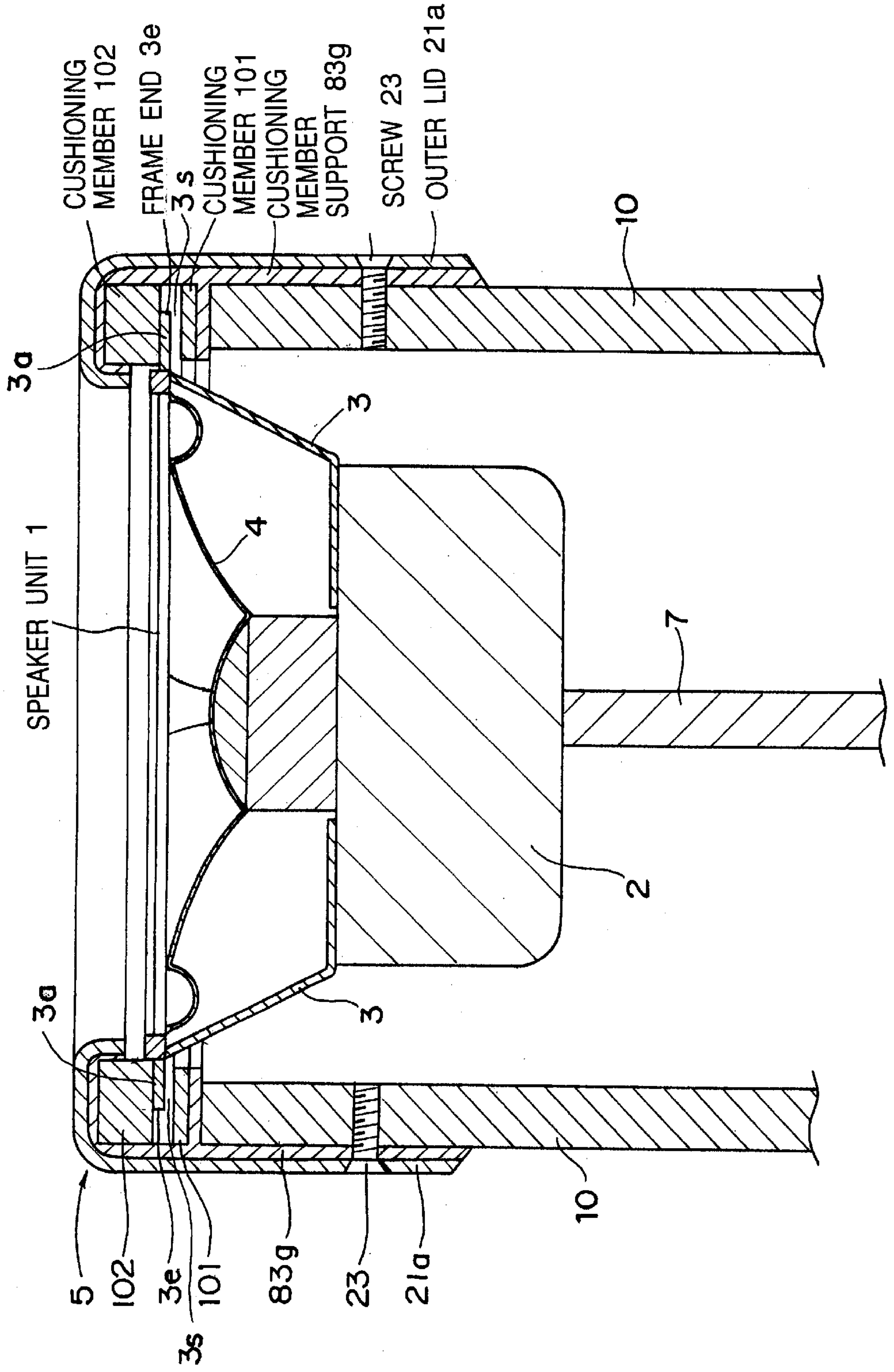
FIG. 25 is a longitudinal sectional view of a configuration of a speaker apparatus of a fifteenth modified preferred embodiment according to the present invention, which is a still further modified preferred embodiment of the second preferred embodiment.

FIG. 25 is a longitudinal sectional view of a configuration of a speaker apparatus of a fifteenth modified preferred embodiment according to the present invention, which is still another modified preferred embodiment of the second preferred embodiment.

The fifteenth modified preferred embodiment shows in detail the structure of the frame fitting part 5 of the self-supporting speaker apparatus according to the second preferred embodiment. When the fifteenth modified preferred embodiment comprises cushioning members 101 and 102 and a cushioning member support 83*g*, which are made in a manner similar to that of the seventh modified preferred embodiment shown in FIG. 13, the fifteenth modified preferred embodiment has such a structure that a part of the fitting part 3*a* and the top surface of the frame end 3*e* are in contact with the lower surface of the cushioning member 102 at the frame fitting part 5, so that the frame 3 supports the speaker housing 10. Thus, the space 3*s* is formed under a part of the fitting part 3*a* and the frame end 3*e*. The cushioning member 101 corresponds to the cushioning member 81, the cushioning member 102 corresponds to the cushioning member 82, and the cushioning member support 83*g* corresponds to the cushioning member 83. However, the cushioning member 101 has the same function as that of the cushioning member 82.

Figure 26:
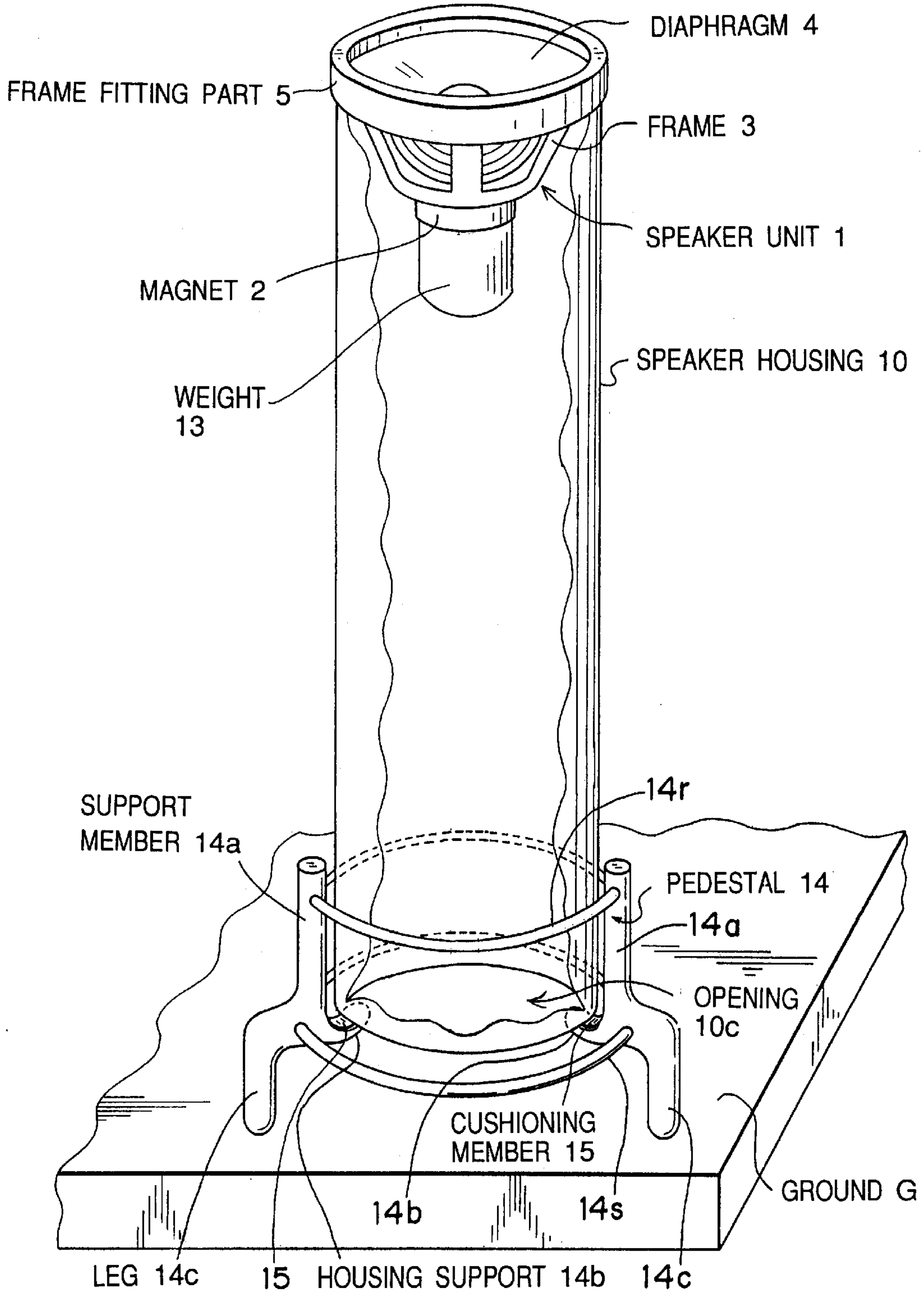
FIG. 26 is a longitudinal sectional view of a configuration of a speaker apparatus of a sixteenth modified preferred embodiment according to the present invention, which is a further modified preferred embodiment of the first preferred embodiment.

FIG. 26 is a longitudinal sectional view of a configuration of a speaker apparatus of a sixteenth modified preferred embodiment according to the present invention, which is a further modified preferred embodiment of the first preferred embodiment.

The sixteenth modified preferred embodiment shows a method of dealing with difficulty in forming the structure having the support bar 7 and the weight 13 shown in FIG. 1. That is, under the constraint that the simplification of the structure of the speaker apparatus is desired or that the installation of the speaker housing 10 may be slightly inclined from the vertical direction, a weight 13*b* may be fitted directly under the magnet 2 of the speaker unit 1 as shown in FIG. 26, instead of the structure having the support bar 7 and the weight 13. Thus, the structures of the support bar 7 and the weight 13 are made remarkably simple.

Figure 27:
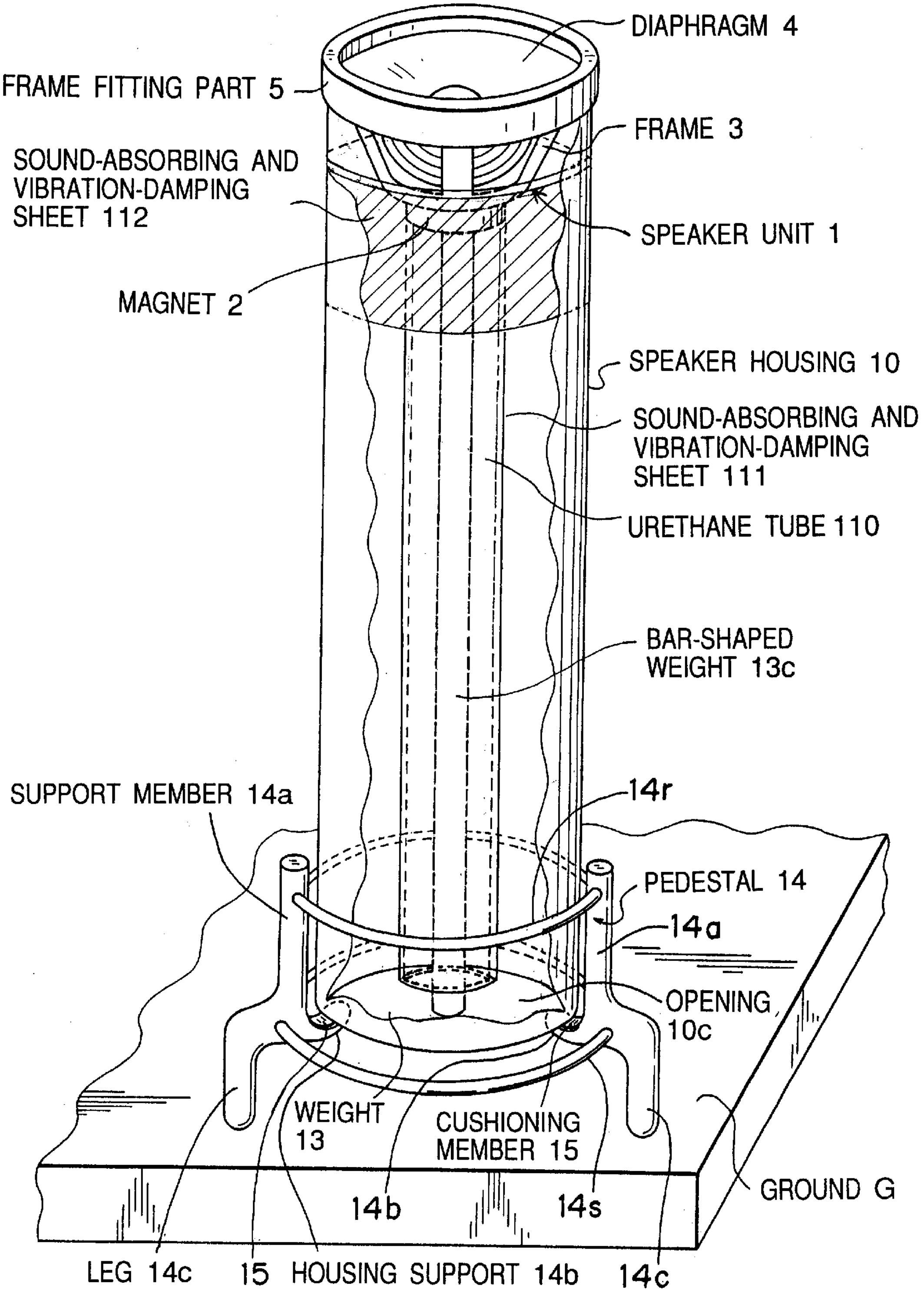
FIG. 27 is a longitudinal sectional view of a configuration of a speaker apparatus of a seventeenth modified preferred embodiment according to the present invention, which is a still further modified preferred embodiment of the first preferred embodiment.

FIG. 27 is a longitudinal sectional view of a configuration of a speaker apparatus of a seventeenth modified preferred embodiment according to the present invention, which is a further modified preferred embodiment of the first preferred embodiment. The seventeenth modified preferred embodiment differs from the first preferred embodiment shown in FIG. 1 at the following points.

(a) The support bar 7 and the weight 13 are replaced by a bar-shaped weight 13*c* having the weight of the support bar 7 and the weight 13.

(b) An outer peripheral surface of the general whole (or may be a part) of the bar-shaped weight 13*c* located directly under the speaker unit 1 is surrounded by a cylindrical urethane tube 110. A sound-absorbing and vibration-attenuating sheet 111 made of, for example, Microwool™ or the like is wound around the outer peripheral surface of the urethane tube 110. Further, a sound-absorbing and vibration-attenuating sheet 112 is wound so as to be filled into the speaker housing 10 in the uppermost portion of the sound-absorbing and vibration-attenuating sheet 111 (i.e., the position of about ⅙ of the length of the bar-shaped weight 13*c* located directly below the speaker unit 1). Each of the sound-absorbing and vibration-attenuating sheets 111 and 112 is made of thin glass wool or thin felt. Each of the sound-absorbing and vibration-attenuating sheets 111 and 112 has a function of absorbing the sound waves radiated from the back surface of the diaphragm 4 and also has a further function of limiting the vibration or oscillation radiated and transmitted from the back surface of the diaphragm 4.

In the seventeenth modified preferred embodiment having the above-described configuration, the sound waves and vibration radiated from the back surface of the speaker unit 1 can be absorbed and limited by the sound-absorbing and vibration-attenuating sheets 111 and 112.

In the above-described seventeenth modified preferred embodiment, the sound-absorbing and vibration-attenuating sheet 112 is wound so as to be filled into the speaker housing 10 at the uppermost portion of the sound-absorbing and vibration-attenuating sheet 111 (i.e., the position of about ⅙ of the length of the bar-shaped weight 13*c* located directly below the speaker unit 1). However, the filling position is not limited to the position of ⅙, and may be any position of from 2/6 to 1. In other words, alternatively, the sound-absorbing and vibration-attenuating sheets 111 and 112 may be filled over the whole outer periphery of the urethane tube 110.

In the above-described seventeenth modified preferred embodiment, the urethane tube 110 is used. However, the present invention is not limited to the modified preferred embodiment. Without use of the urethane tube 110, only the sound-absorbing and vibration-attenuating sheets 111 and 112 may be wound around the bar-shaped weight 13*c* and filled into the speaker housing 10. At the time of filling the sound-absorbing and vibration-attenuating sheets 111 and 112, a range of the longitudinal position of the bar-shaped weight 13*c* is not limited to the upper portion directly under the speaker unit 1, and may be the lower portion, a portion ranging from the upper portion to the lower portion, or the whole range.

A method of filling the urethane tube 110 and the sound-absorbing and vibration-attenuating sheets 111 and 112 shown in the seventeenth modified preferred embodiment and the modified preferred embodiment thereof can be applied to not only the first preferred embodiment, but also the other preferred embodiments or modified preferred embodiments.

In the above-described preferred embodiments, the shape of the speaker housing 10 is cylindrical, but the present invention is not limited to the cylindrical shape. Preferably, the speaker housing 10 has a cylindrical shape such as an elliptical cylindrical shape. Moreover, the speaker housing 10 has a cylindrical shape or an elliptical cylindrical shape that substantially has no flat surface or corner, and this leads to an improvement in the physical rigidity of the speaker housing 10, and thus the generation of vibration can be prevented. Furthermore, the speaker housing 10 has a cylindrical shape having no corner surface, and this leads to vibration mode resulting from the reflection of a vibration wave, mainly a longitudinal wave, by the surface of the speaker housing 10 which can be simplified. Thus, radiation of noisy sound waves from the surface of the speaker housing 10 by the simplified vibration mode can be greatly reduced, as compared with the sound waves radiated from a general box-shaped speaker housing. Moreover, high-order components or higher harmonics components of the radiated sound waves is reduced. Therefore, any deterioration of quality of a reproduced sound can be prevented.

In the above-described preferred embodiments and modified preferred embodiments, the speaker apparatus according to the present invention is classified into a plurality of preferred embodiments. However, the present invention is not limited to these preferred embodiments. A combination of components of sections of the speaker apparatus may be any combination.

Advantageous Effects of Preferred Embodiments

As described in detail above, the speaker apparatus according to the preferred embodiment of the present invention, the speaker housing is cylindrical, and the weight is connected to the back surface of the magnet through the support bar secured to the back surface of the magnet. Thus, the reactance component of the acoustic impedance of the back surface of the speaker unit is reduced. Therefore, the impedance load can be substantially equal to the load of pure resistance. As a result, a high-quality reproduced sound having less disturbance in the relative time relationship among element waveforms constituting a musical sound or the like can be obtained. Moreover, the speaker housing is allowed to stand upright, and thus the front surface of the speaker unit is directed upward. Thus, horizontal directivity about the sound waves from the speaker unit can have an angle of 360 degrees. Therefore, the coverage area for listening can be remarkably increased. In addition, reproducibility of the sound field space can be improved. Thus, a complicated waveform of a low frequency such as a musical sound or the like can be reproduced with higher improved fidelity.

In the above-mentioned speaker apparatus, the support bar and the weight are preferably formed by an integrated bar-shaped weight. Therefore, the structure of the speaker apparatus can be simplified.

The above-mentioned speaker apparatus preferably further comprises a first cushioning member interposed when dividing the support bar into two parts, where the first cushioning member attenuates and suppresses vibration or oscillation transmitted from the magnet to the support bar. Therefore, when the first cushioning member is interposed, the mechanical impedance is suddenly changed, and the mechanical vibration transmitted from the upper portion of the support bar to the supporting means can be attenuated and reduced. Further, the vibration or oscillation, which cannot be absorbed and is reflected by the supporting means and the ground, can be also attenuated and reduced. Therefore, a complicated waveform of low frequency such as a musical sound or the like can be reproduced with higher improved fidelity.

The above-mentioned speaker apparatus preferably further comprises a second cushioning member interposed between the speaker unit and the speaker housing, where the second cushioning member attenuates and suppresses vibration or oscillation transmitted from the speaker unit to the speaker housing. Therefore, the speaker unit is flexibly supported by the second cushioning member. Thus, unnecessary vibration of the speaker unit is prevented from being transmitted to the speaker housing. When the speaker housing is vibrated or oscillated by backward sound pressure radiated by the speaker unit, the vibration or oscillation is prevented from being transmitted to the speaker unit. Accordingly, a complicated waveform of low frequency such as a musical sound or the like can be reproduced with higher improved fidelity.

In the above-mentioned speaker apparatus, preferably, the frame of the speaker unit has a frame fitting part inclined from the vertical direction, and the second cushioning member is formed so as to be fitted to the frame fitting part, to be inclined from the vertical direction and to support the frame fitting part. Therefore, the centripetal force toward the center axis is exerted on the frame end of the speaker unit. As a result, the speaker unit can be horizontally held about the center axis thereof with the oscillating surface of the diaphragm directed upward (with the cylindrical speaker housing installed in the vertical direction, namely, so that the axis direction of the cylindrical speaker housing is parallel to the vertical direction).

In the above-mentioned speaker apparatus, the frame fitting part preferably comprises a plurality of projections or protrusions to be press-fitted into the second cushioning member. It is therefore possible to ensure that the frame is held on the second cushioning member while holding the center axis in the center.

The above-mentioned speaker apparatus preferably further comprises an adaptive ring member interposed between the speaker unit and the second cushioning member and having a shape adapted to support and fix the frame of the speaker unit. Therefore, a commercially available speaker unit having a horizontal frame fitting part is held on the second cushioning member. In this case, the centripetal force toward the center axis is exerted on the frame end of the speaker unit. As a consequence, the speaker unit can be horizontally held about the center axis thereof with the oscillating surface of the diaphragm directed upward (with the cylindrical speaker housing installed in the vertical direction, namely, so that the axis direction of the cylindrical speaker housing is parallel to the vertical direction). That is, even the commercially available speaker unit can be applied to the speaker apparatus of the present invention.

The above-mentioned speaker apparatus preferably further comprises means for substantially absorbing and limiting the sound waves and vibration radiated from a back surface of the diaphragm. Therefore, the reactance component of the acoustic impedance of the back surface of the speaker unit is reduced. Thus, the impedance load can be substantially equal to the load of pure resistance. As a result, a high-quality reproduced sound having less disturbance in the relative time relationship among element waveforms constituting a musical sound or the like can be obtained.

In the speaker apparatus, the speaker unit and the speaker housing are preferably formed so that a diameter of the frame of the speaker unit is substantially equal to a diameter of a cylinder of the speaker housing. Therefore, with the speaker housing, a cylindrical tube is used as a speaker box. Thus, the sound waves radiated to the back surface of the speaker unit contains only plane waves propagating in the axial direction of the speaker housing. Accordingly, such complicated standing waves as might be generated in a general speaker box is not generated. Consequently, a complicated waveform of a low frequency such as a musical sound can be reproduced with higher improved fidelity.

The above-mentioned speaker apparatus preferably further comprises means for substantially horizontally diffusing or reflecting the sound waves radiated from the front surface of the diaphragm. Therefore, a listener can listen to the sound from the speaker unit over a wider area.

In the above-mentioned speaker apparatus, the housing preferably has a cylindrical shape or an elliptical cylindrical shape. Conseqently, the vibration mode resulting from the reflection of a vibration wave, mainly longitudinal waves, by the surface of the speaker housing can be simplified. Thus, the radiation of noisy sound waves from the surface of the speaker housing by the simplified vibration mode can be greatly reduced, as compared with the sound waves radiated from a general box-shaped speaker housing. Moreover, high-order components or higher harmonics of the radiated sound waves is reduced. Therefore, any deterioration of quality of a reproduced sound can be prevented. Thus, a complicated waveform of low frequency such as a musical sound or the like can be reproduced with higher improved fidelity.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A speaker apparatus comprising:

a speaker unit including a magnet, a frame and a diaphragm, said speaker unit electromechanically transducing an input low-frequency signal into oscillation to oscillate said diaphragm, and to generate and radiate sound waves from a front surface of said diaphragm;

a speaker housing having a substantially cylindrical shape, said speaker housing having such a structure that said speaker unit is secured onto one end surface of said cylindrical shape of said speaker housing so as to substantially cover said speaker unit except for front and back surfaces of said diaphragm, and said speaker housing having an opening in another end surface of said cylindrical shape thereof;

a support bar extending and having one end secured to a back surface of said magnet of said speaker unit; and a weight secured to another end of said support bar, said weight holding said support bar in a substantially vertical direction and grounding said magnet acoustically and virtually, thereby attenuating and suppressing oscillation transmitted from said magnet to said support bar.

2. The speaker apparatus as claimed in claim 1, wherein said speaker unit and said speaker housing are formed so that a diameter of the frame of said speaker unit is substantially equal to a diameter of a cylinder of said speaker housing.

3. The speaker apparatus as claimed in claim 1, further comprising:

diffusing means for, in the horizontal direction, substantially diffusing or reflecting the sound waves radiated from the front surface of said diaphragm.

4. The speaker apparatus as claimed in claim 1, wherein said speaker housing has either one of a cylindrical shape and an elliptical cylindrical shape.

* * * * *